(12) United States Patent
Srinivasan et al.

(10) Patent No.: US 9,331,507 B2
(45) Date of Patent: *May 3, 2016

(54) CONTROL APPARATUS AND METHOD FOR CONDUCTING FAST BATTERY CHARGE

(71) Applicant: The Johns Hopkins University, Baltimore, MD (US)

(72) Inventors: Rengaswamy Srinivasan, Ellicott City, MD (US); Bliss G. Carkhuff, Laurel, MD (US)

(73) Assignee: The Johns Hopkins University, Baltimore, MD (US)

( * ) Notice: Subject to any disclaimer, the term of this patent is extended or adjusted under 35 U.S.C. 154(b) by 411 days.

This patent is subject to a terminal disclaimer.

(21) Appl. No.: 13/859,375

(22) Filed: Apr. 9, 2013

(65) Prior Publication Data
US 2013/0264999 A1 Oct. 10, 2013

Related U.S. Application Data

(63) Continuation-in-part of application No. 13/275,664, filed on Oct. 18, 2011, now Pat. No. 8,961,004.

(60) Provisional application No. 61/394,100, filed on Oct. 18, 2010, provisional application No. 61/659,531, filed on Jun. 14, 2012.

(51) Int. Cl.
| | |
|---|---|
| *H02J 7/04* | (2006.01) |
| *H02J 7/00* | (2006.01) |
| *H01M 2/34* | (2006.01) |
| *H01M 10/48* | (2006.01) |
| *H01M 10/44* | (2006.01) |
| *G01R 31/36* | (2006.01) |
| *H01M 10/0525* | (2010.01) |

(52) U.S. Cl.
CPC ............... *H02J 7/0052* (2013.01); *H01M 2/34* (2013.01); *H01M 2/348* (2013.01); *H01M 10/443* (2013.01); *H01M 10/486* (2013.01); *G01R 31/3606* (2013.01); *G01R 31/3658* (2013.01); *H01M 10/0525* (2013.01); *H01M 2200/10* (2013.01); *Y02T 10/7011* (2013.01)

(58) Field of Classification Search
USPC ........................................................ 320/150
See application file for complete search history.

(56) References Cited

U.S. PATENT DOCUMENTS

| | | | |
|---|---|---|---|
| 5,537,042 A | 7/1996 | Beutler et al. | |
| 5,703,471 A | 12/1997 | Bullock et al. | |
| 6,002,238 A | 12/1999 | Champlin | |

(Continued)

FOREIGN PATENT DOCUMENTS

JP 11-162526 6/1999

*Primary Examiner* — Robert Grant
(74) *Attorney, Agent, or Firm* — Noah J. Hayward

(57) ABSTRACT

A battery charging system includes a charging source, at least one battery cell, a battery internal temperature sensor configured to measure an internal temperature of the at least one battery cell responsive to charging of the at least one battery cell by the charging source, and a charge controller. The charge controller is configured to receive indications of the internal temperature of the at least one battery cell over time, to identify an indication that the at least one battery cell is at a point of full charge based on rate of change of the internal temperature, and to interrupt power delivery from the charging source to the at least one battery cell responsive to the indication that the at least one battery cell is at the point of full charge.

20 Claims, 19 Drawing Sheets

(56) References Cited

U.S. PATENT DOCUMENTS

| | | |
|---|---|---|
| 6,025,696 A | 2/2000 | Lenhart et al. |
| 6,437,543 B1 | 8/2002 | Oler et al. |
| 7,059,769 B1 | 6/2006 | Protega |
| 7,868,591 B2 | 1/2011 | Phillips et al. |
| 7,878,242 B2 | 2/2011 | Gray |
| 8,961,004 B2 * | 2/2015 | Srinivasan ............ H01M 2/34 320/150 |
| 2005/0060109 A1 | 3/2005 | Caffrey et al. |
| 2006/0214639 A1 * | 9/2006 | Miwa et al. .................. 320/134 |
| 2009/0017364 A1 | 1/2009 | Manev |
| 2009/0259420 A1 | 10/2009 | Greening et al. |
| 2010/0104927 A1 | 4/2010 | Albright |

* cited by examiner

CONTROL APPARATUS AND METHOD FOR CONDUCTING FAST BATTERY CHARGE

CROSS-REFERENCE TO RELATED APPLICATIONS

This application is a continuation-in-part of co-pending U.S. patent application Ser. No. 13/275,664, entitled "BATTERY PHASE METER TO DETERMINE INTERNAL TEMPERATURES OF LITHIUM-ION RECHARGEABLE CELLS UNDER CHARGE AND DISCHARGE" filed Oct. 18, 2011, which claims priority to and the benefit of U.S. Provisional Application No. 61/394,100 filed on Oct. 18, 2010, and this application also claims priority to and the benefit of U.S. Provisional Application No. 61/659,531 filed on Jun. 14, 2012, the entire contents of each of which are hereby incorporated herein by reference.

TECHNICAL FIELD

The disclosure generally relates to battery charging technology and, more specifically, relates to an apparatus and method to facilitate fast battery charging without causing battery cell damage.

BACKGROUND

Excursions in the internal temperature in rechargeable lithium-ion cells may occur rapidly, within milliseconds to tens of seconds. Moreover, a relatively modest but rapid elevation of internal temperature may result in damage to a solid electrolyte interface/interphase (SEI) layer, electrolyte degradation, and/or chemical decomposition within the cell. While initial damage may be heat-induced, the initial damage leads to an exothermic reaction, which may result in an autocatalytic process known as thermal runaway. Consequently, a sudden heat excursion may lead to initial damage in the form of a beak-down or rupture of the SIE layer. This may place an electrolyte in contact with a carbon anode, which may result in a reaction that releases additional heat and leads to thermal runaway.

Prior studies indicate that a nominally protective SEI layer may be damaged at temperatures as low as 70° C. Moreover, the time scale associated with thermal runaway is short, depending on a state-of-charge (SoC). At an ambient temperature of approximately 25° C. and 100% SoC, thermal runaway may occur within a few seconds, whereas at less than 50% SoC, thermal runaway may occur over tens of seconds.

Conventional surface-mounted temperature sensors do not adequately track internal temperature changes, regardless of a sampling rate used to digitize sensor output. This is because surface mounted temperature is a low-pass-filtered reflection of internal temperature. In other words, surface-mounted temperatures sensors do not reflect fast changes in internal temperature, such as changes over less than a few seconds. Conventional surface-mounted temperature sensors are thus inadequate to detect or predict thermal runaway.

BRIEF SUMMARY

Example embodiments enable the provision of a battery charging system capable of providing for relatively fast charging without damaging the battery cells. However, regardless of the speed of charging, example embodiments further enable efficient and safe charging that focuses on the identification of the point of full charge on the basis of measuring internal battery temperatures.

In one example embodiment, a battery charging system is provided. The battery charging system may include a charging source, at least one battery cell, a battery internal temperature sensor configured to measure an internal temperature of the at least one battery cell responsive to charging of the at least one battery cell by the charging source, and a charge controller. The charge controller may be configured to receive indications of the internal temperature of the at least one battery cell over time, identify an indication that the at least one battery cell is at a point of full charge based on changes in the internal temperature, and interrupt power delivery from the charging source to the at least one battery cell responsive to the indication that the at least one battery cell is at the point of full charge.

In another example embodiment, a method of controlling a battery charging process is provided. The method may include receiving indications of an internal temperature of at least one battery cell from a battery internal temperature sensor, identifying an indication that the at least one battery cell is at a point of full charge based on changes in the internal temperature, and interrupting power delivery from a charging source to the at least one battery cell responsive to the indication that the at least one battery cell is at the point of full charge.

In another example embodiment, a battery charging controller is provided. The battery charging controller may include processing circuitry. The battery charging controller may be in communication with a battery internal temperature sensor configured to measure an internal temperature of at least one battery cell responsive to charging of the at least one battery cell by a charging source. The processing circuitry may be configured to receive indications of the internal temperature of the at least one battery cell over time, identify an indication that the at least one battery cell is at a point of full charge based on changes in the internal temperature, and interrupt power delivery from the charging source to the at least one battery cell responsive to the indication that the at least one battery cell is at the point of full charge.

BRIEF DESCRIPTION OF THE SEVERAL VIEWS OF THE DRAWINGS

Figure 1:
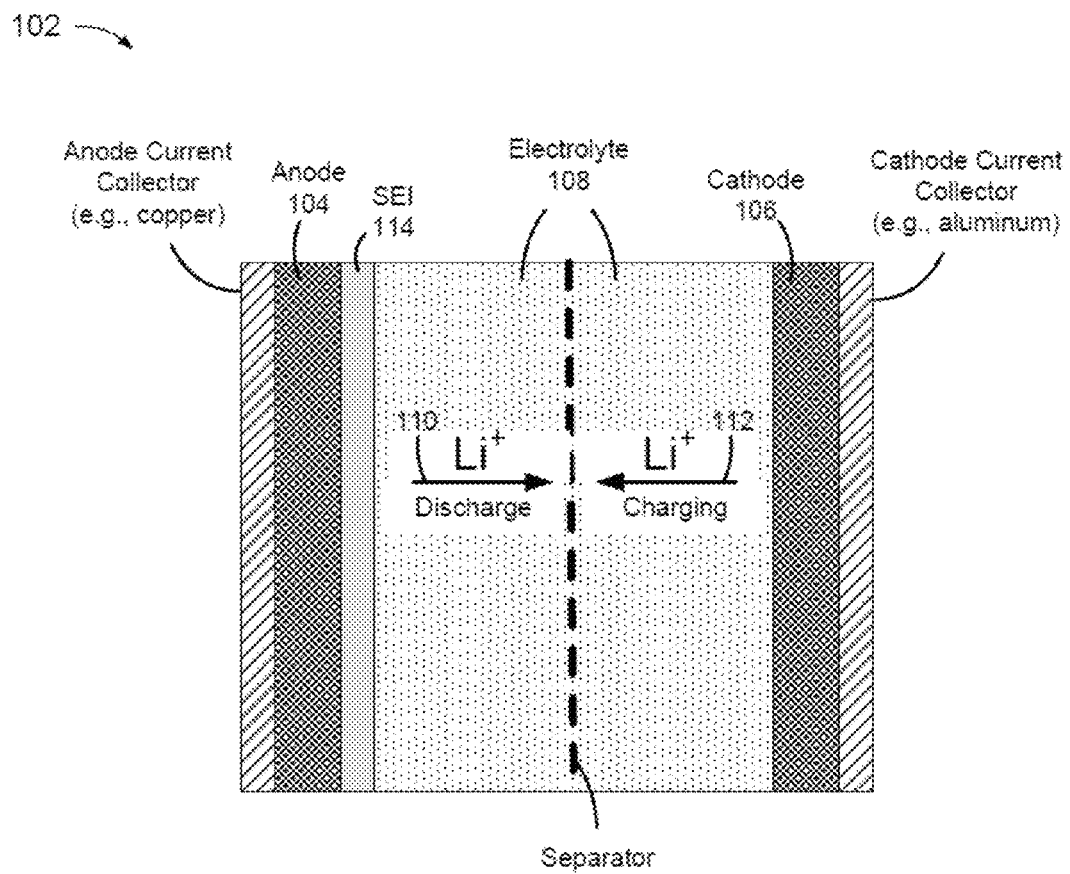
Figure 2:
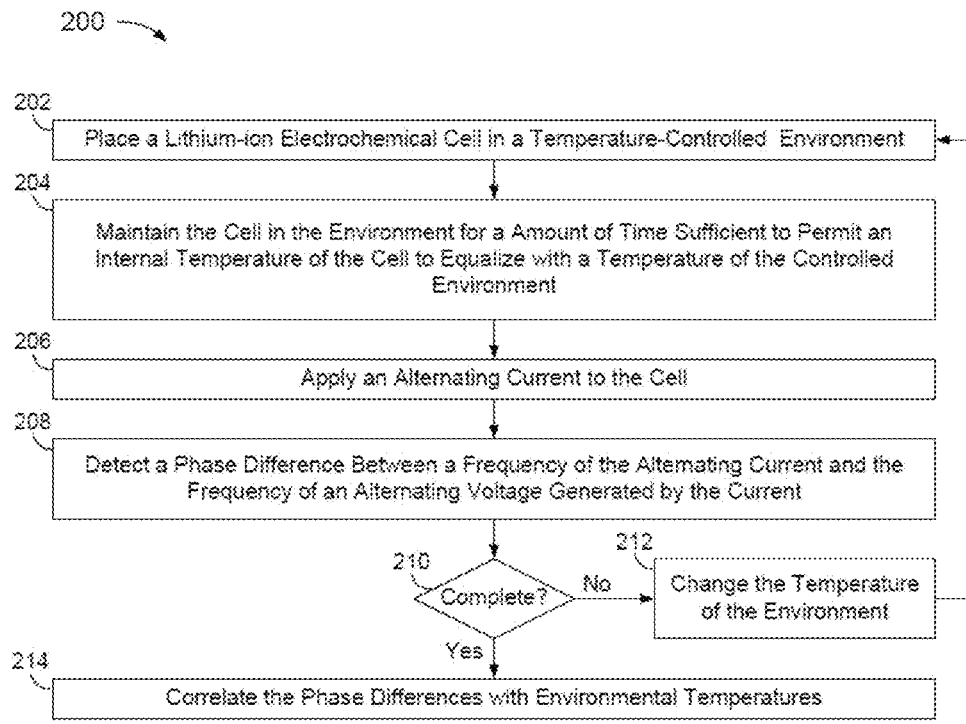
Figure 3:
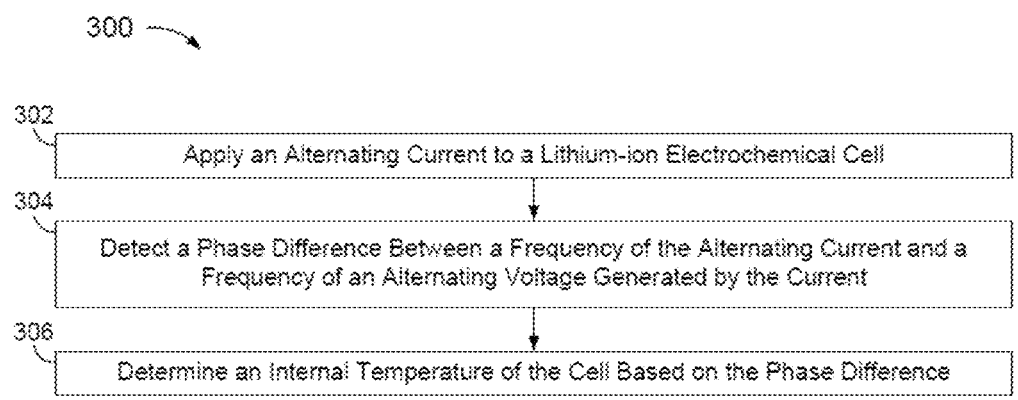
Figure 4:
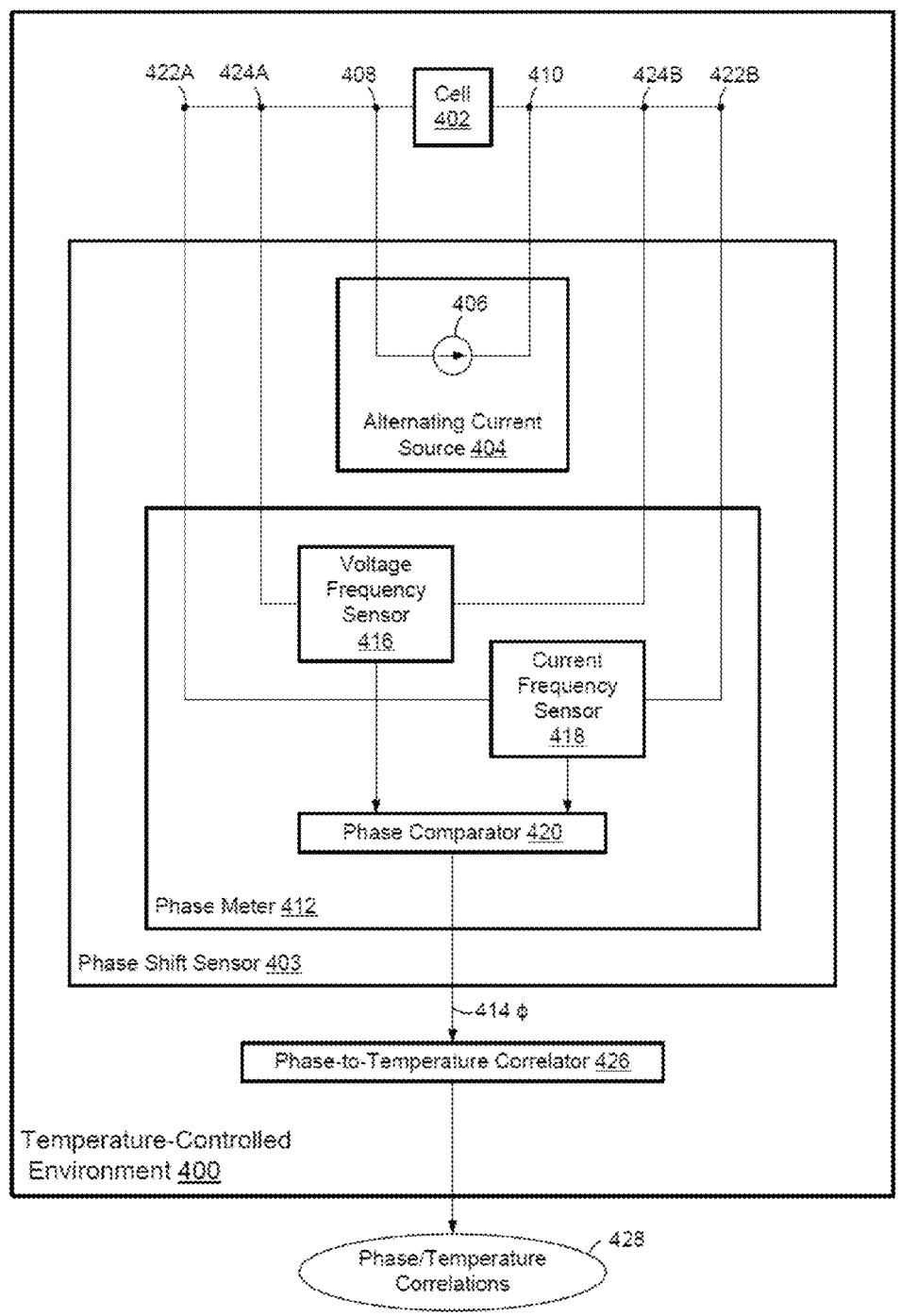
Figure 5:
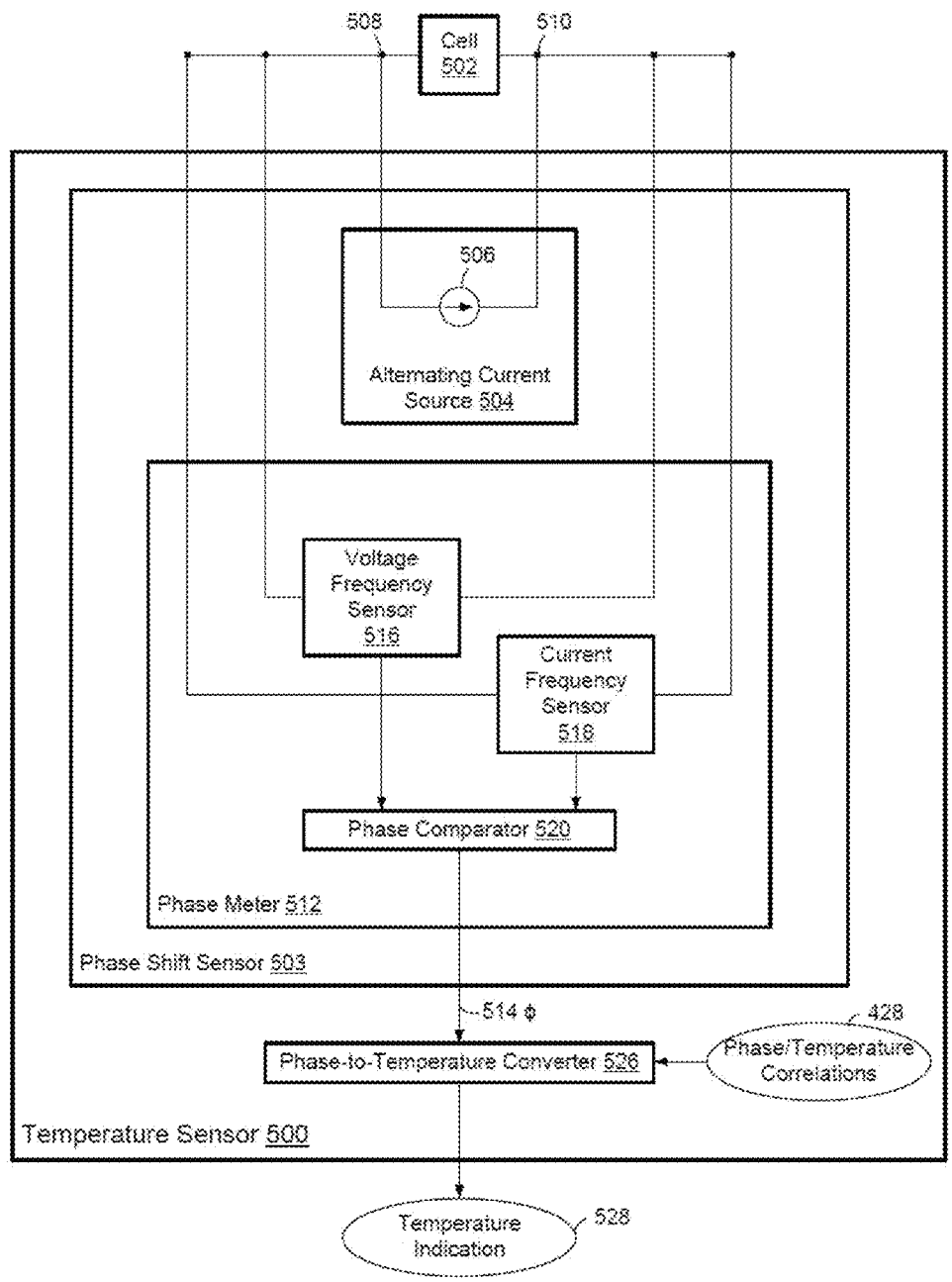
Figure 6:
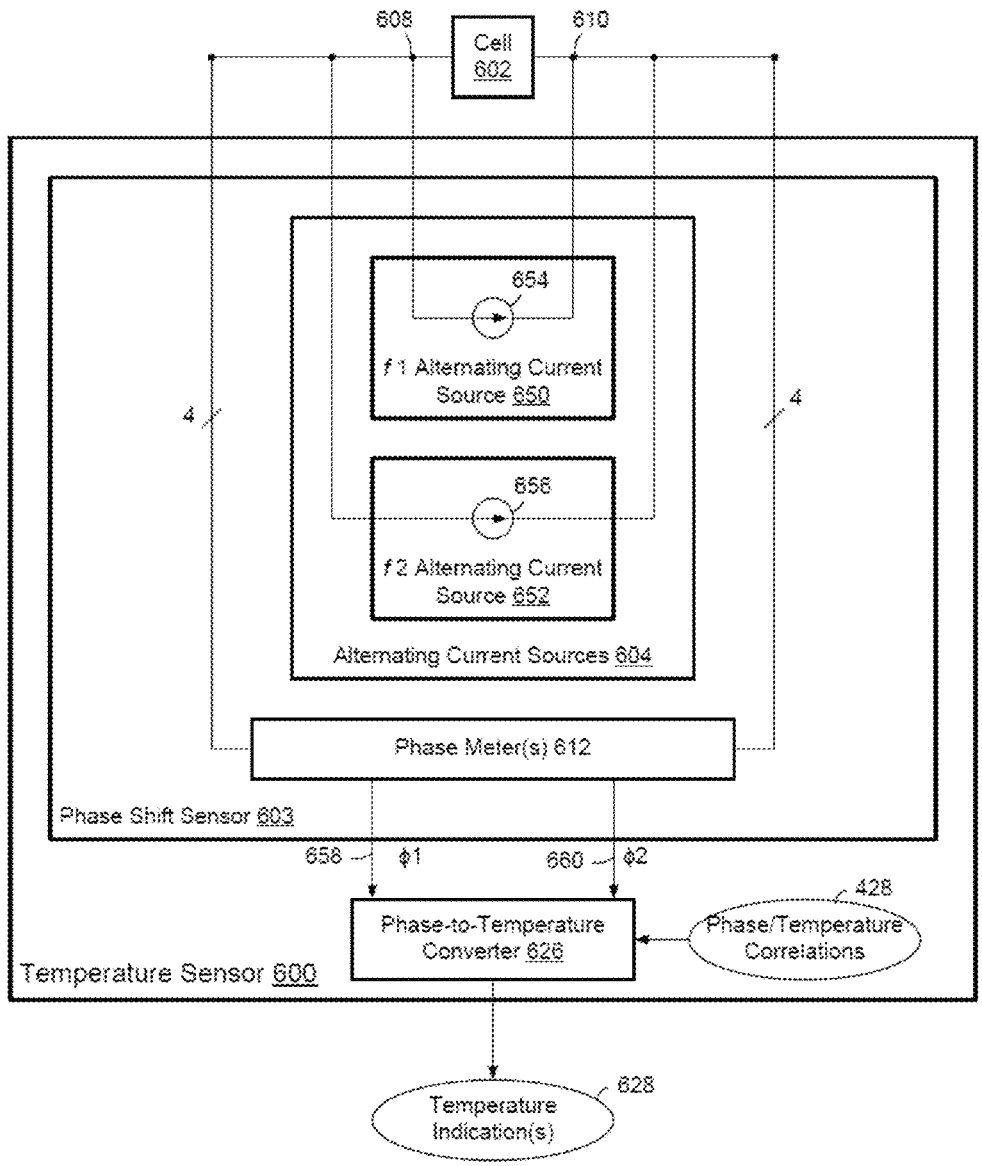
Figure 7:
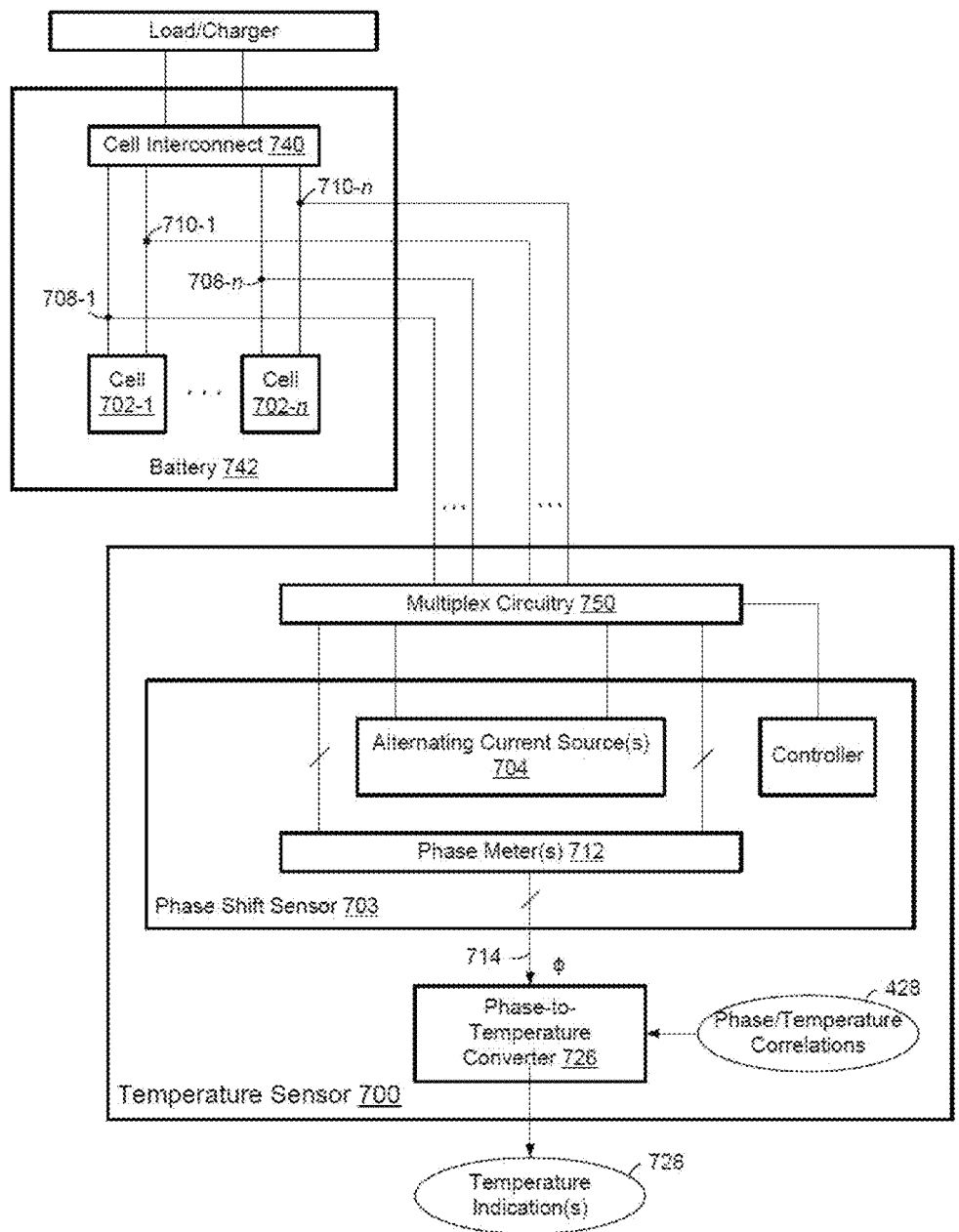
Figure 8:
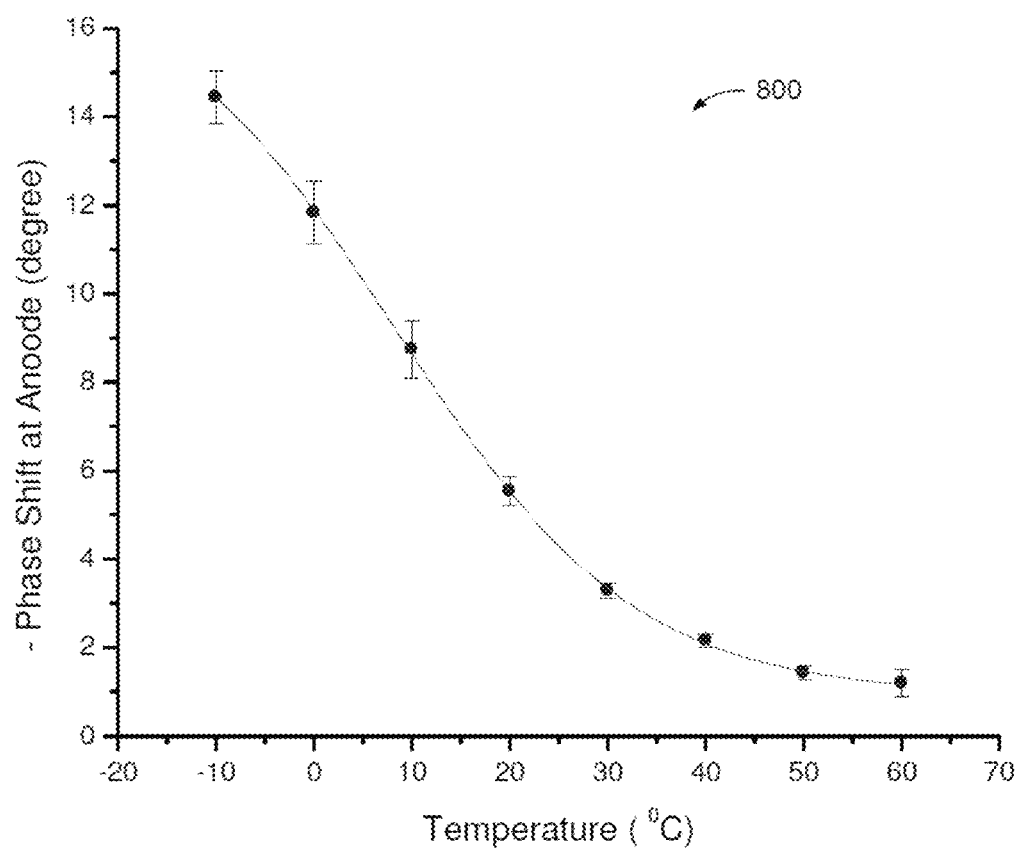
Figure 9:
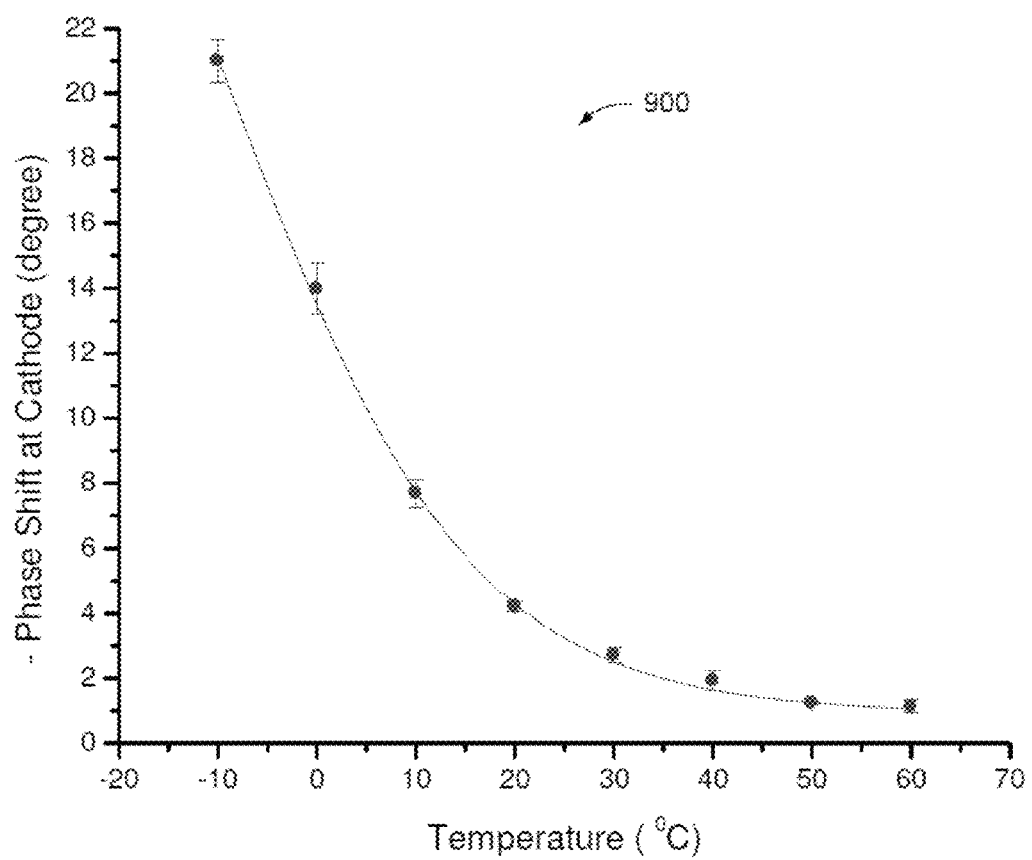
Figure 10:
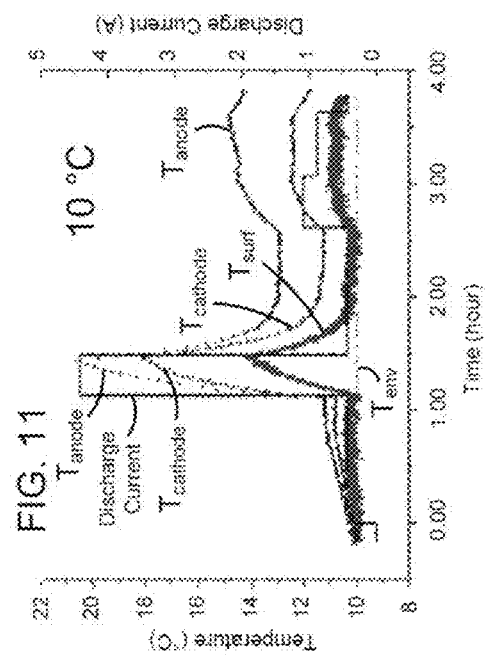
Figure 11:
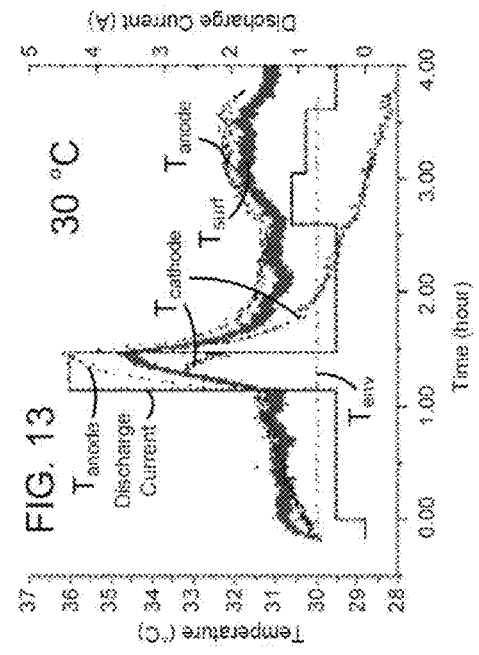
Figure 12:
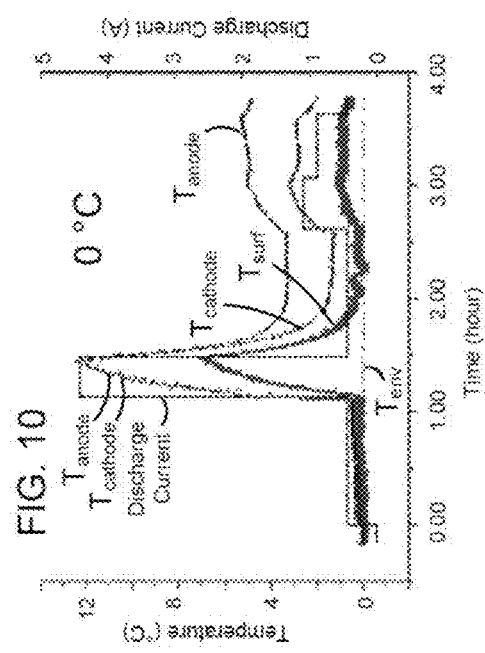
Figure 13:
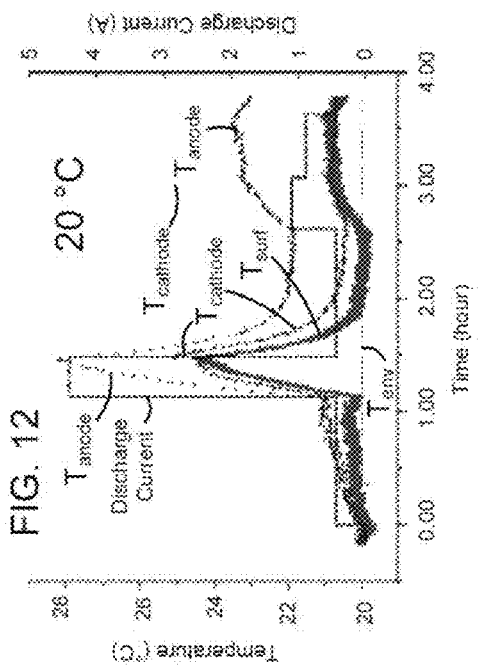
Figure 14:
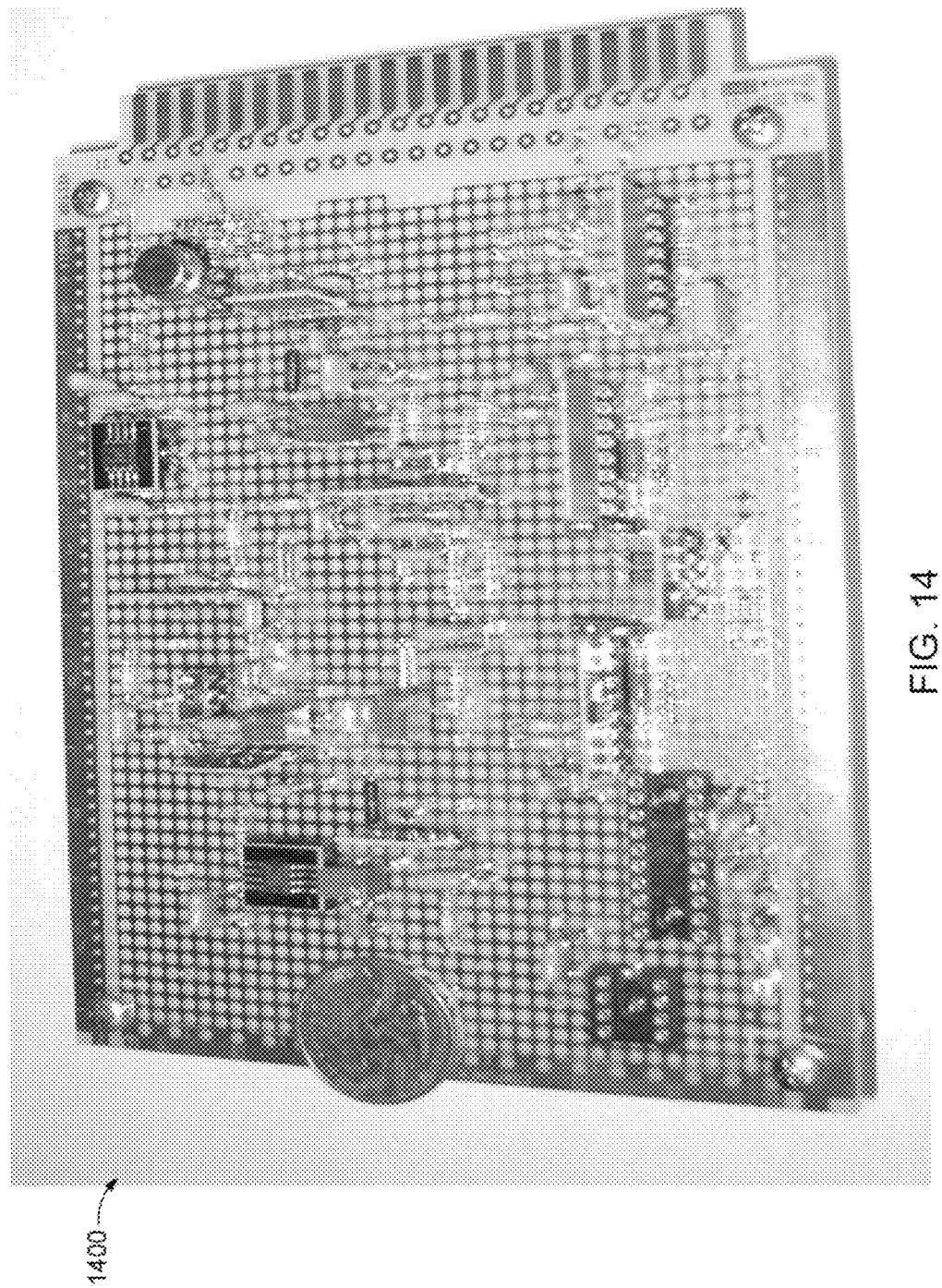
Figure 15:
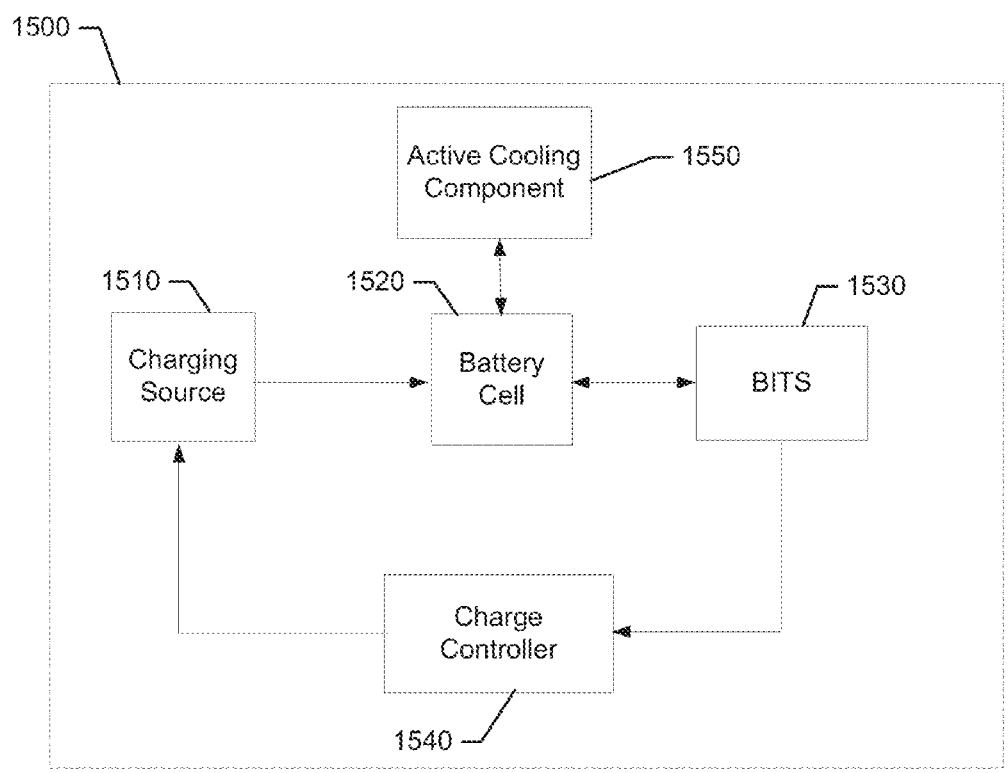
Figure 16:
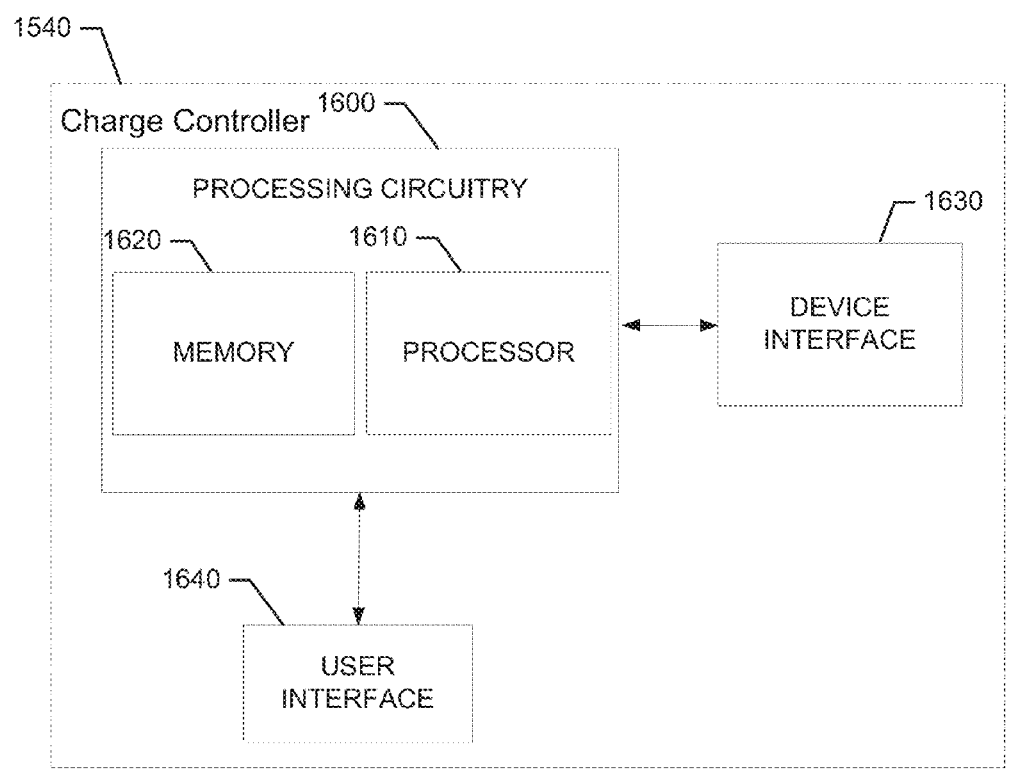
Figure 17:
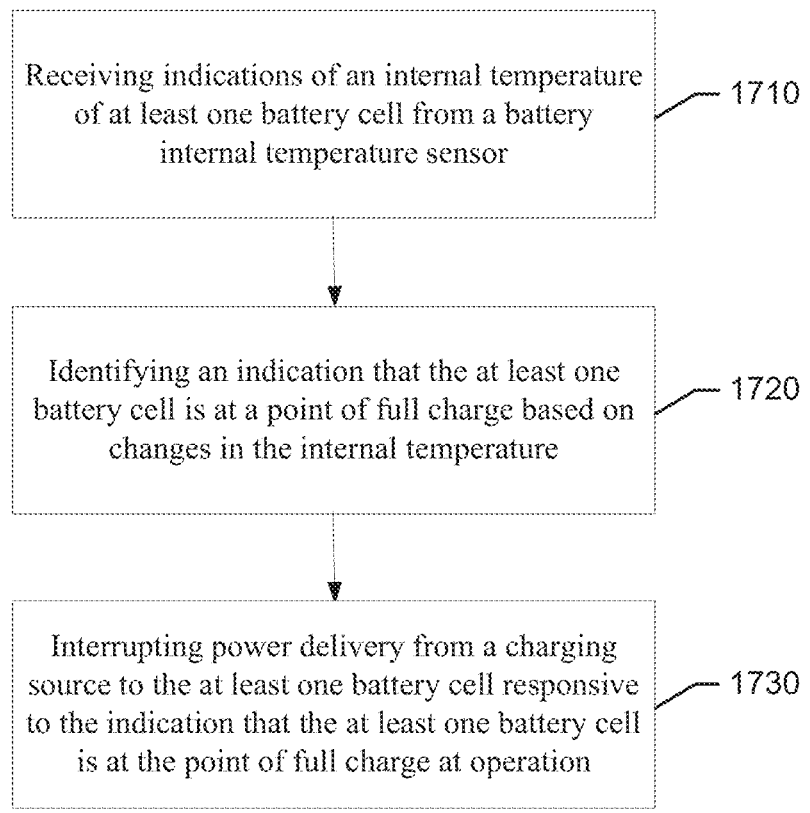
Figure 18:
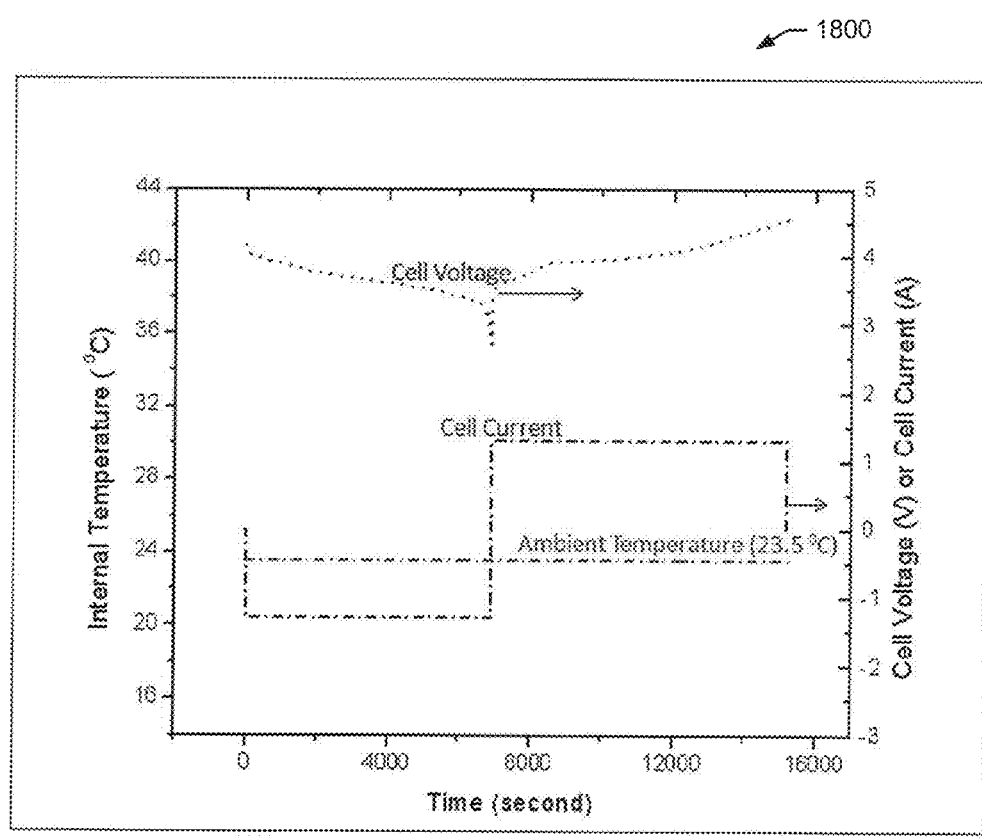
Figure 19:
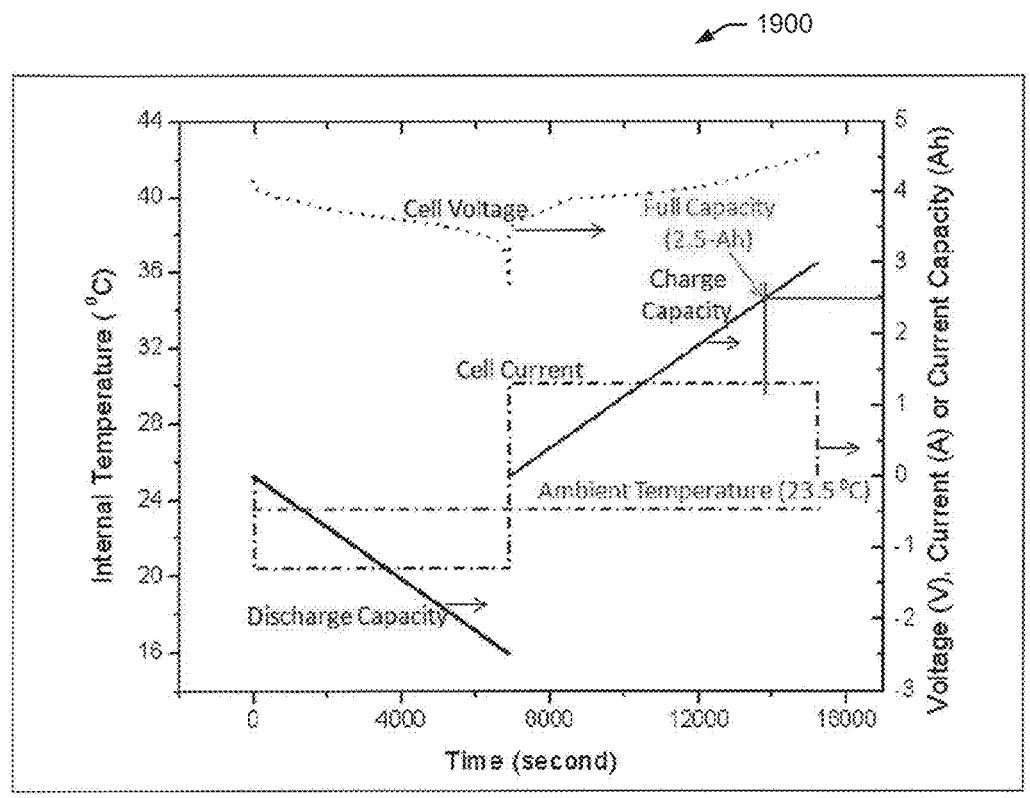
Figure 20:
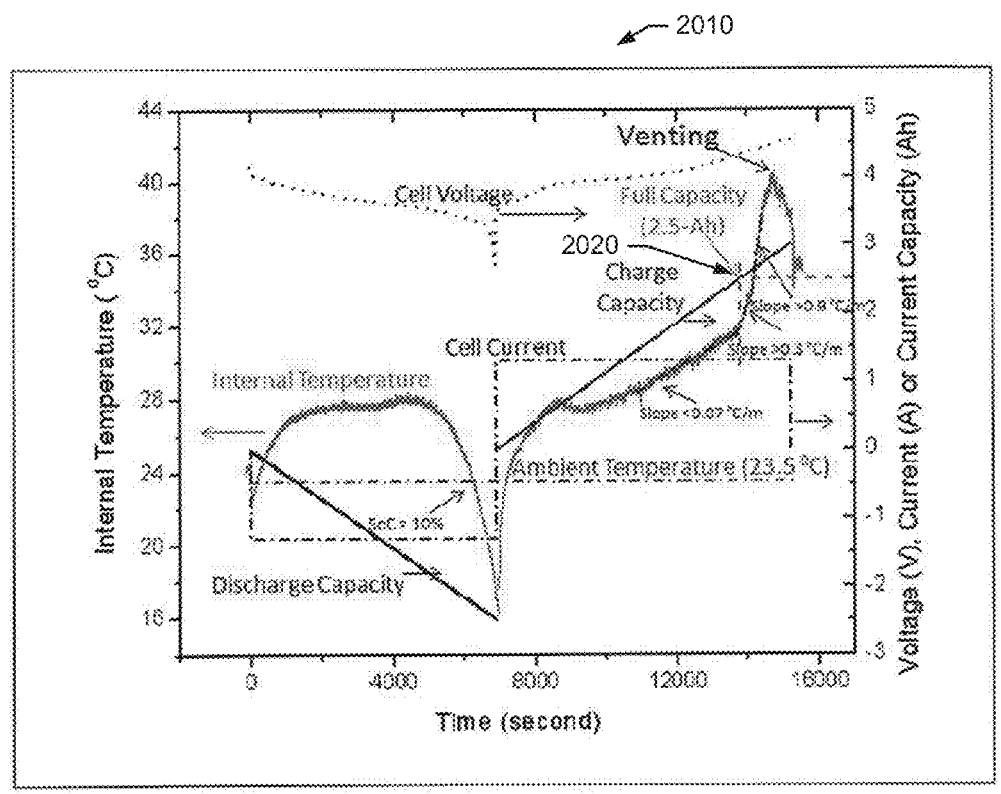
Figure 21:
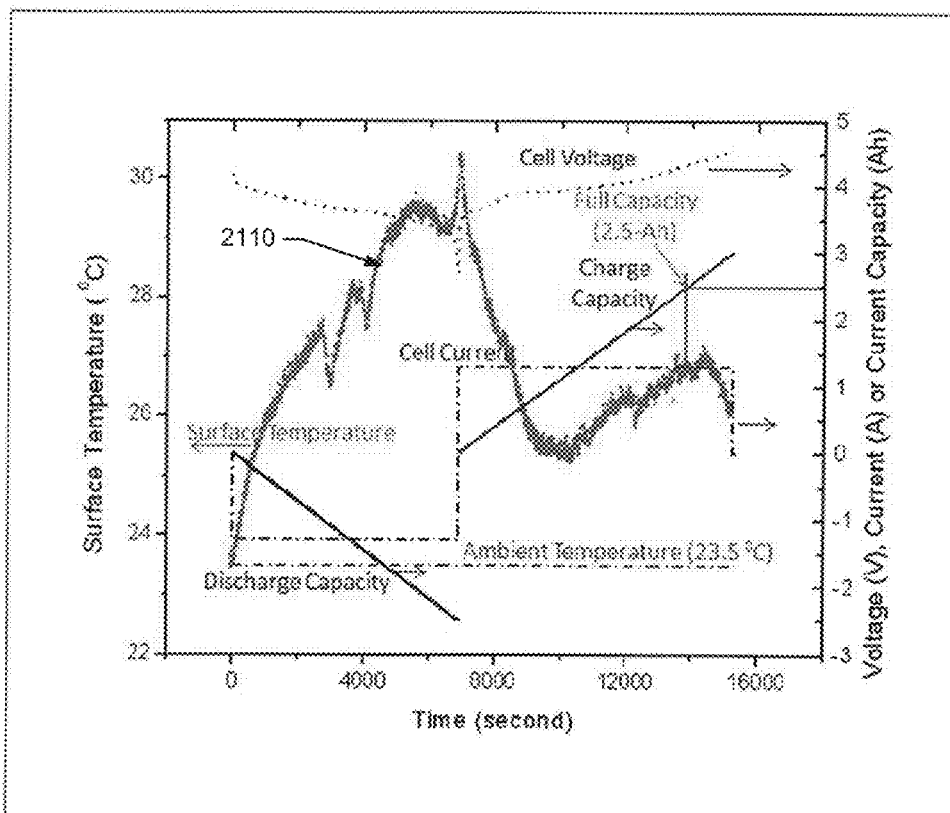
Figure 22:
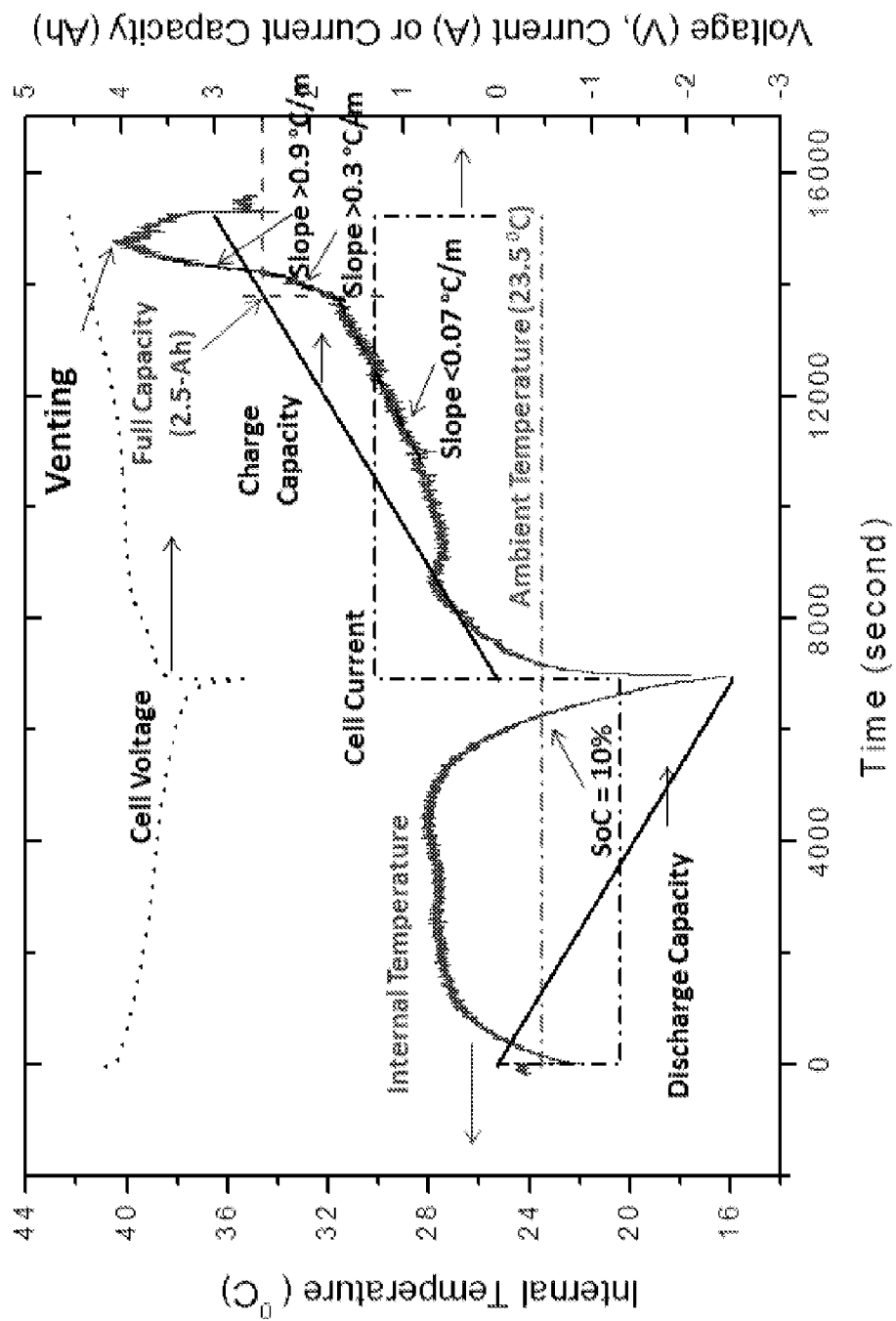
Figure 23:
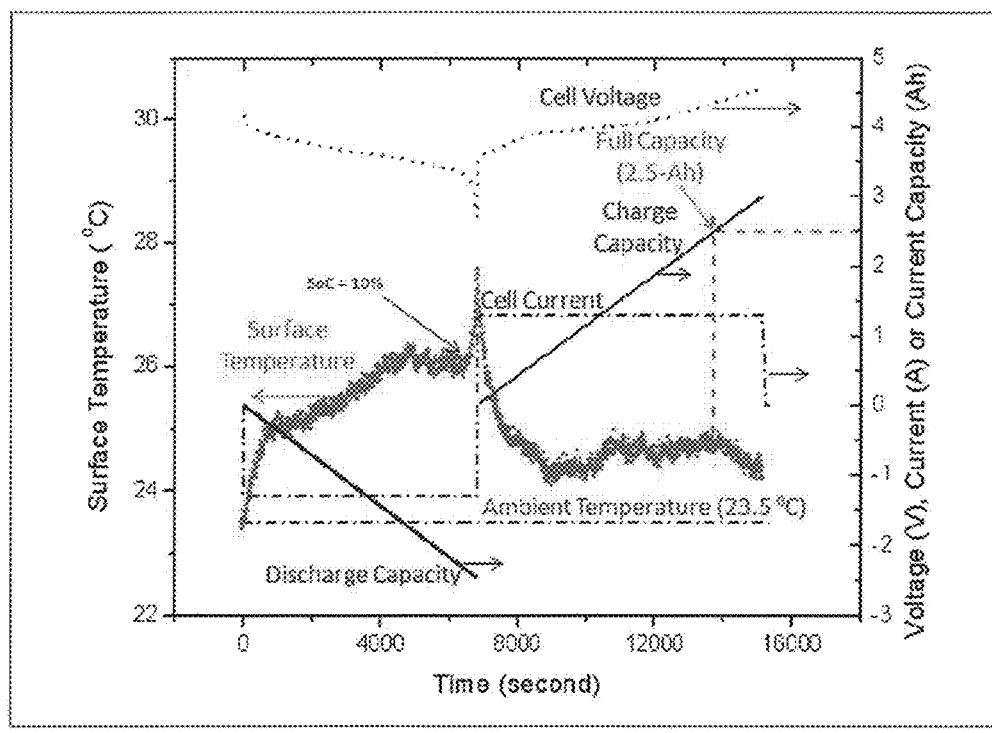

Having thus described example embodiments in general terms, reference will now be made to the accompanying drawings, which are not necessarily drawn to scale, and wherein:

FIG. 1 is a block diagram of a lithium-ion cell according to an example embodiment;

FIG. 2 is a flowchart of a method of correlating a phase delay of a lithium-ion cell with a corresponding internal temperature of the cell, for a range of temperatures according to an example embodiment;

FIG. 3 is a flowchart of a method of determining an internal temperature of a lithium-ion cell based on a phase delay of the cell according to an example embodiment;

FIG. 4 is a block diagram of a system to correlate a phase delay of a lithium-ion cell with an internal temperature of the cell, for a range of temperatures according to an example embodiment;

FIG. 5 is a block diagram of a temperature sensor to determine an internal temperature of a lithium-ion cell based on a phase-delay of the cell according to an example embodiment;

FIG. 6 is a block diagram of a temperature sensor to determine internal anode and cathode temperatures of a lithium-ion cell, based on phase delays attributable to corresponding frequency-dependent impedance domains of the cell according to an example embodiment;

FIG. 7 is a block diagram of a temperature sensor to determine internal temperatures of multiple lithium-ion cells, based on phase delays of the corresponding cells according to an example embodiment;

FIG. 8 is graph of phase shift versus anode temperature of a lithium-ion cell, measured in the absence of charge or discharge at 20%, 50% and 80% state-of-charge (SoC) and averaged; each data point represent the mean (shown as a dot) and standard deviation (shown as a vertical line with bars);

FIG. 9 is graph of phase shift versus cathode temperature of a lithium-ion cell, measured in the absence of charge or discharge at 20%, 50% and 80% state-of-charge (SoC) and averaged; each data point represent the mean (shown as a dot) and standard deviation (shown as a vertical line with bars);

FIG. 10 is graph of validation data for an environmental temperature of 0° C. according to an example embodiment;

FIG. 11 is graph of validation data for an environmental temperature of 10° C. according to an example embodiment;

FIG. 12 is graph of validation data for an environmental temperature of 20° C. according to an example embodiment;

FIG. 13 is graph of validation data for an environmental temperature of 30° C. according to an example embodiment;

FIG. 14 is an image of a temperature sensor circuit to detect phase shifts in a lithium-ion cell and determine an internal temperature of the cell based on the phase shift according to an example embodiment;

FIG. 15 illustrates a block diagram showing one example of a battery charging system of an example embodiment;

FIG. 16 illustrates a block diagram of a battery charge controller in accordance with an example embodiment;

FIG. 17 shows an exemplary block diagram of a method according to an example embodiment FIG. 18 illustrates a discharge-charge current profile with the corresponding cell voltage and ambient temperature according to an example embodiment;

FIG. 19 illustrates a chart showing the same set of cell operating conditions as FIG. 18, with the cell's discharge-capacity and charge-capacity (in units of Ah) superimposed according to an example embodiment;

FIG. 20 shows the internal temperature profile during the charge process demonstrated in FIG. 19 in ambient conditions according to an example embodiment;

FIG. 21 shows the cell surface temperature measured during the same charging process shown in FIG. 19 in ambient conditions according to an example embodiment;

FIG. 22 shows the internal temperature profile during the charge process demonstrated in FIG. 19 in the presence of forced cooling according to an example embodiment; and FIG. 23 shows the cell surface temperature measured during the same charging process shown in FIG. 19 in the presence of forced cooling according to an example embodiment.

DETAILED DESCRIPTION

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout.

As indicated above, some example embodiments may enable the provision of a mechanism by which to monitor internal battery cell temperatures so that control of a charging process may be maintained to reduce the potential for cell venting or other potentially damaging conditions. In an example embodiment, an internal temperature sensor may be provided within the battery cell to allow monitoring of internal temperature. Control circuitry may be used to detect the point of full charge (PFC) based on detection of a sharp increase in internal temperature. When PFC is detected based on internal temperature, the control circuitry may further act to stop further charging (e.g., by interrupting the delivery of power to the cell). The cell may therefore reach the PFC and, relatively quickly thereafter, the charge may be terminated so that venting cannot occur.

FIG. 1 is a block diagram of a lithium-ion cell 102, including electrodes 104 and 106, and an electrolyte 108 to provide a conducting medium between electrodes 104 and 106. In FIG. 1, electrode 104 is illustrated as an anode 104, and electrode 106 is illustrated as a cathode 106.

Rechargeable, or secondary lithium-ion cell chemistry is based on intercalation and de-intercalation, or insertion and extraction of lithium ions into and out of open crystalline or amorphous structures, or lattices of anode 104 and cathode 106.

Electrolyte 108 may include at least one type of lithium salt dissolved in an aprotic organic solvent, and electrodes 104 and 106 may be fabricated from materials for which lithium ions can migrate into and out of. Such electrodes are called intercalation hosts.

Anode 104 may include carbon, such as graphite or crystalline or amorphous silicon or alloys of silicon with elements such as gallium, or a mixture of graphite and any form or alloy of silicon.

Cathode 106 may include a metal oxide, such as, without limitation, lithium cobalt oxide, lithium manganese dioxide, lithium nickel oxide, or a mixture of several metal oxides.

Cathode 106 may include a layered oxide, such as lithium cobalt oxide, a polyanion, such as lithium iron phosphate, or a spinel, such as lithium manganese oxide, or non-oxide salts such as lithium iron tri-fluoride.

Cathode 106 may be coated with a relatively thin but stable layer of carbon, aluminum oxide, tungsten oxide, titanium oxide, aluminum phosphate or aluminum fluoride to prevent electrolyte 108 and an associated electrolyte solvent from reacting with cathode 106.

When discharging, lithium ions extract from anode 104, migrate across electrolyte 108, and insert into cathode 106, as illustrated by an arrow 110. Compensating electrons travel away from the anode 104 through an external load to balance the reaction. When charging, lithium ions are extracted from cathode 106, migrate across electrolyte 108, and insert anode 104, as illustrated by an arrow 112.

By convention, current is defined as traveling in the opposite direction of electron travel. Anode 104 may be referred to as a negative electrode, and cathode 106 may be referred to as a positive electrode.

During an initial, or formation charge of cell 102, electrolyte 108 may react with carbon anode 104 during, which may cause a relatively thin protective solid electrolyte interface/interphase (SEI) layer 114 to develop. SEI layer 114 may or increases an internal impedance of cell 102, restrict or moderate charge flow between cathode 106 and anode 104, and may impact high and/or low temperature performance.

The metal oxide cathode 106 may have a relatively thin protective layer of carbon, aluminum oxide, tungsten oxide, titanium oxide, aluminum phosphate or aluminum fluoride to prevent the cathode from reacting with the electrolyte and the electrolyte solvent. The protective carbon or the oxide layer may or increases an internal impedance of cell 102, restrict or moderate charge flow between cathode 106 and anode 104, and may impact high and/or low temperature performance.

Further to the discussion above regarding potential heat-related damage, a sudden heat excursion within cell 102 may lead to break-down and/or rupture of SEI layer 114, or the protective layer on the cathode 106, which may place electrolyte 108 and carbon anode 104 and the electrolyte 108 and cathode 106 in contact with one another, which may restart the reaction described above, which may release additional heat and lead to thermal runaway.

It is known that impedance due to SEI layer 114 and the protective layer on the cathode 106 are substantially independent of the state-of-charge (SoC) of cell 102.

It is also known that impedance due to SEI layer 114 and the protective layer on the cathode 106 are predominately dependent upon, or a function of the internal temperature of cell 102. In other words, impedance due to SEI layer 114 and the protective layer on the cathode 106 change with internal cell temperature.

Disclosed herein are methods and systems to determine an internal temperature of a lithium-ion cell based on a phase delay of the cell. The phase delay may be a function of the impedance of the cell in that the phase delay may be directly or indirectly related to the impedance, but is not a measure of the cell impedance. Internal cell temperature may be determined substantially instantaneously based on a phase delay at a given instance in time.

As described below with reference to FIG. 2, a lithium-ion cell may be evaluated to correlate a phase delay with an internal cell temperature, for a range of temperatures.

The correlations may be used to determine an internal temperature of the cell and/or another cell, based on a phase delay of the cell, such as described below with reference to FIG. 3.

Phase delay may be measured or detected as a phase difference between a frequency of an alternating signal applied to the cell and a frequency of a phase-shifted alternating signal generated at the cell in response to the applied signal.

The applied signal may include an alternating current and the phase-shifted signal may include an alternating voltage. Alternatively, the applied signal may include an alternating voltage and the phase-shifted signal may include an alternating current. Examples are provided below with respect to alternating currents applied to a cell. Methods and systems disclosed herein are not, however, to application of an alternating current.

An externally-generated alternating current may be applied to cell 102 to generate an alternating voltage at or between cathode 106 and anode 104. The impedance of cell 102 may impart a phase shift to a frequency of the alternating voltage, relative to a frequency of the alternating current.

FIG. 2 is a flowchart of a method 200 of correlating a phase shift of a lithium-ion cell with a corresponding internal temperature of the cell, for a range of temperatures.

At 202, a lithium-ion cell is placed in a temperature-controlled environment.

At 204, the cell is maintained in the temperature-controlled environment for a time sufficient to permit an internal temperature of the cell to equalize with a temperature of the environment.

At 206, after the amount of time at 204, an alternating, or sinusoidal current, for example, is applied to the cell. The alternating current results in an alternating voltage across a cathode and anode of the cell. In additional embodiments, non-sinusoidal wave forms, such as square wave, rectangular wave and other current and voltage pulses of different shapes, may also be used in place of the sinusoidal current.

At 208, a phase shift is detected as a difference between a frequency of the alternating current and a frequency of the alternating voltage.

At 210, where a phase shift is to be detected for another temperature, processing proceeds to 212 where the temperature of the environment is changed. Processing then returns to 202.

At 214, the detected phase shifts and corresponding environmental temperatures are correlated. The correlating may include interpolating between phase shifts detected at 210 and corresponding environmental temperatures, such as to provide a continuous correlation over a range of temperature.

The correlations generated at 214 may be used to determine an internal temperature of a lithium-ion cell based on a phase delay of the cell, such as described below with reference to FIG. 3.

FIG. 3 is a flowchart of a method 300 of determining an internal temperature of a lithium-ion cell based on a phase delay of the cell.

At 302, an alternating current is applied to a lithium-ion cell to generate an alternating voltage across cathode and anode terminals of the cell, such as described above with respect to 206.

At 304, a phase difference between a frequency of the alternating current and a frequency of the alternating voltage is detected.

At 306, an internal temperature of the cell is determined based on the phase difference.

The determining at 306 may include referencing the correlations of 214 in FIG. 2, which may be provided in look-up table.

A lithium-ion cell, such as cell 102 in FIG. 1, may exhibit multiple frequency-dependent impedance domains. Example frequency domains are provided below. Methods and systems disclosed herein are not, however, limited to the examples below. Frequency ranges may vary based on characteristics of an SEI layer and/or the protective layer on the anode and the cathode.

A first frequency-dependent impedance domain may include a capacitive reactance between approximately 40 Hertz (Hz) and 500 Hz, which may be attributable to a graphite anode impedance and, more particularly, to the impedance of SEI layer 114 on anode 104. In this frequency domain, impedance of cell 102 may be predominantly anode impedance.

A second frequency-dependent impedance domain may include a capacitive reactance between approximately 1 Hz and 30 Hz, which may be attributable to the impedance of SEI layer 114 on cathode 106. In this frequency domain, impedance of cell 102 may be predominantly cathode impedance.

Method 200 and/or method 300 may be performed with respect to one or more frequency-dependent impedance domains.

For example, method 200 and/or method 300 may be performed with respect to a frequency within a range of approximately 40 Hz to 500 Hz to measure an internal cell temperature as a function of SEI layer impedance on an anode. Such a temperature is referred to herein as $T_{anode}$.

Similarly, method 200 and/or method 300 may be performed with respect to a frequency within a range of approximately 10 Hz to 30 Hz to measure an internal cell temperature as a function of SEI layer impedance on a cathode. Such a temperature is referred to herein as $T_{cathode}$.

Method 200 and/or method 300 may be performed with respect to $T_{anode}$ and $T_{cathode}$. For example, multiple alternating currents may be applied to cell 102, sequentially or concurrently, and phase shifts may be detected with respect to each of the currents. Where multiple currents are applied concurrently, frequencies of alternating voltage frequencies may be separated with frequency filtering.

Example systems to correlate phase shifts with internal cell temperatures, and to determine an internal cell temperature based on the correlations, are disclosed below with reference to FIGS. 4-7.

FIG. 4 is a block diagram of a temperature-controlled environment 400, including a phase shift sensor 400 to detect phase shifts 414 and a phase-to-temperature correlator 426 to correlate phase shifts 414 with temperatures of environment 400.

Cell 402 includes an anode terminal 408 and a cathode terminal 410, each in electrical contact with a corresponding anode and cathode of cell 402.

Phase shift sensor 403 may include an alternating or sinusoidal current source 404 to apply an alternating current 406 to cell 402.

Current source 404 may be implemented to apply current 406 to cell 402 while cell 402 is discharging and/or charging. Current source 404 may be implemented to direct current 406 into cathode terminal 408 and/or anode terminal 406.

When current 406 is applied to cell 406, a corresponding alternating voltage is generated at, or across terminals 408 and 410.

Phase shift sensor 403 may include a phase meter 412 to detect a phase difference 414 between a frequency of current 406 and a frequency of the alternating voltage.

Phase shift sensor 403 may include a voltage source instead of, or in addition to current source 404, and phase meter 412 may be implemented to detect phase difference 414 with respect to an applied voltage and a resultant current, such as described further above.

In the example of FIG. 4, phase meter 412 includes four probes, including current frequency probes 422A and 422B, and voltage frequency probes 424A and 424B.

Phase meter 412 may include an electrochemical interface potentiostat/galvanostat, and a frequency response analyzer, and/or portions thereof sufficient to detect phase difference 410.

For illustrative purposes, phase meter 412 is functionally illustrated in FIG. 4 as including a voltage frequency sensor 416 to determine a frequency of the alternating voltage, a current frequency sensor 418 to determine a frequency of current 406, and a phase comparator 420 to determine a phase difference between the frequencies of alternating current 406 and the alternating voltage.

Phase-to-temperature correlator 426 may output phase-shift/temperature correlations 428, which may be used to calibrate a temperature sensor, such as described below with reference to one of more of FIGS. 5-7.

Correlations 428 may be recorded in a tangible medium, which may include a computer-readable tangible medium and/or circuitry. Correlations 428 may be recorded, for example, in a data structure, such as a look-up table.

Phase-to-temperature correlator 426 may be implemented to interpolate between, and/or extrapolate from phase shifts 414 and corresponding environmental temperatures, such as to provide correlations for a continuous range of phase shift and temperature.

In FIG. 4, current source 404 may be implemented with respect to a frequency-dependent impedance domain of cell 402. For example, current source 404 may generate alternating current 406 within a range of approximately 40 Hz to 100 Hz to correlate phase shifts 414 with $T_{anode}$, or within a range of approximately 10 Hz to 20 Hz to correlate phase shifts 414 with $T_{cathode}$.

Current source 404 may be configurable, or programmable to control the frequency of current 406. A programmable current source 404 may be programmed to operate at a selected frequency, and/or to switch between multiple frequencies, such as to correlate phase shifts 414 with $T_{anode}$ and $T_{cathode}$. Alternatively, multiple current sources may be utilized to provide multiple current frequencies to cell 402, such as described below with reference to FIG. 6.

FIG. 5 is a block diagram of a temperature sensor 500 to determine an internal temperature of a lithium-ion cell 502 based on a phase-shift of cell 502.

Cell 502 includes an anode terminal 508 and a cathode terminal 510, each in electrical contact with a corresponding anode and a cathode of cell 502.

Temperature sensor 500 includes a phase shift sensor 503 to sense a phase shift imparted by impedance of cell 502, such as described above with respect to phase shift sensor 403 in FIG. 4.

Phase shift sensor 503 may include an alternating or sinusoidal current source 504 to apply an alternating current 506 to cell 502, such as described above with respect to current source 404 in FIG. 4.

Phase shift sensor 503 may include a phase meter 512 to detect a phase difference 514 between a frequency of current 506 and a frequency of a corresponding alternating voltage, such as described above with respect to phase meter 412 in FIG. 4

Temperature sensor 500 may further include a phase-to-temperature converter 526 to convert phase indication 514 to a temperature indication 528, based on correlations 428.

Converter 522 may be implemented to interpolate between, and/or extrapolate from, phase shifts and corresponding temperatures of correlations 428, such as where phase shift 514 is not identical to a phase shift in correlations 428.

Converter 522 may be implemented to output temperature indication 524 as a digital and/or analog value.

Converter 522 may be implemented to output temperature indication 524 as a measure of temperature, such as in degrees C., and/or as a relative indication, such as relative to one or more threshold values.

Temperature indication 524 may be provided to a display and/or to another system, such as a monitor and/or control system.

Temperature sensor 500 may be implemented to continuously measure the internal temperature of cell 502, or periodically sample the internal temperature of cell 502.

Current source 504 may be implemented with respect to one or more a frequency-dependent impedance domains of cell 502, such as described above with reference to FIG. 4.

FIG. 6 is a block diagram of a temperature sensor 600 to determine internal temperatures $T_{anode}$ and $T_{cathode}$ of a lithium-ion cell 602, based on corresponding frequency-dependent impedance domains of cell 602.

Cell 602 includes an anode terminal 608 and a cathode terminal 610, each in electrical contact with a corresponding anode and cathode of cell 602.

Temperature sensor 600 includes a phase shift sensor 603 to sense phase shifts due to an impedance of cell 602.

Phase shift sensor 603 may include multiple alternating or sinusoidal current sources 604, each to apply a corresponding alternating current to cell 602. The multiple currents may be applied consecutively and/or concurrently. In FIG. 6, current sources 604 include first and second current sources 650 and 652, each to generate a corresponding one of currents 654 and 656. Current 654 may have a frequency within a range of approximately 40 Hz to 100 Hz, and current 656 may have a frequency within a range of approximately 20 Hz to 30 Hz.

Temperature sensor 600 further includes a phase meter 612 to detect first and second phase differences 658 and 660, based on alternating currents generated by currents 654 and 656, and corresponding alternating voltage frequencies.

Phase meter 612 may be implemented similar to phase meter 412 in FIG. 4 and/or phase meter 512 in FIG. 5.

Temperature sensor 600 may include a phase-to-temperature converter 626 to convert phase indications 658 and 660 to one or more temperature indications 628, such as described above with respect to converter 526 in FIG. 5.

Converter 626 may be implemented to output a corresponding temperature indication for each of phase indications 658 and 660, and/or to combine and convert phase indications 658 and 660 to a single temperature indication.

Temperature sensor 600 may be implemented to continuously measure the internal temperature of cell 602, or periodically sample the internal temperature of cell 602.

A temperature sensor as disclosed herein may be implemented to measure internal temperatures of multiple lithium-ion cells, such as described below with reference to FIG. 7.

FIG. 7 is a block diagram of a temperature sensor 700 to determine internal temperatures of multiple lithium-ion cells 702-1 through 702-n, based on phase-shifts of the corresponding cells.

Each of cells 702-1 through 702-n includes a corresponding anode terminal 708 and a cathode terminal 710.

Cells 702-1 through 702-n may be interconnected with a cell interconnect structure 740, which may include a serial and/or parallel interconnect structure. Interconnect structure 740 may be implemented to selectively disconnect one or more of cells, such as in response to an indication of an over-heating condition within the corresponding cell.

Cells 702-1 through 702-n may be implemented as a battery 740, which may include one or more additional sets of cells. Each set of cells may be monitored by a corresponding temperature sensor 700.

Temperature sensor 700 includes a phase shift sensor 703 to detect phase shifts 714 with respect to each of cells 702-1 through 702-n, such as described in one or more examples above.

Temperature sensor 700 may include multiplex circuitry 750 to selectively connect current sources 704 to a one of cells 702-1 through 702-n, and to concurrently connect probes of a phase meter 712 to a corresponding one of cells 702-1 through 702-n.

Temperature sensor 700 further includes a phase-to-temperature converter 726 to convert phase shifts 714 to temperature indications 728, such as described in one or more examples above.

Temperature sensor 700 may be implemented to determine internal temperatures of cells 702-1 through 702-n in a consecutive fashion.

In an embodiment, phase shift of a cell may be monitored over time, continuously or periodically, and pre-emptive or precautionary action may be initiated or invoked when a rate of change of the phase shift meets or exceeds a threshold rate. The phase shift may be determined as a phase difference, such as disclosed in one or more examples herein.

Pre-emptive or precautionary action may be initiated without determining an internal temperature of the cell (i.e., without converting a phase difference to a temperature), and may be implemented without calibrated phase-shift-to-temperature correlations.

The threshold rate may correspond to a rate of change associated with a thermal runaway condition, and/or a rate of change associated with a condition that may lead to thermal runaway. The threshold rate may be determined experimentally and/or based on operating history or experience.

Pre-emptive action may include issuing an alert and/or isolating the cell from one or more of a charging circuit and a discharging circuit. The pre-emptive action may be initiated prior to a thermal runaway condition, and may be initiated to preclude or reduce a degree of thermal runaway.

Experimental Results

A 4.3 Amp-hour (Ah) lithium-ion electrochemical cell was evaluated under dynamic conditions of charge and discharge, over a temperature range of –20° C. to 66° C.

The evaluation collecting phase shift data as described above with respect to method 300, at each of multiple temperatures, and validating the data as described above with respect to method 200.

During data collection, the cell was housed within an environmental chamber to equalize the internal temperature of the cell with the environmental temperature. A battery testing system was used for charging and discharging the cell.

First and second sinusoidal currents were applied to the cell, each having a frequency within a corresponding one of ranges 40 Hz to 100 Hz and 10 Hz to 20 Hz.

Phase shifts were measured at each of multiple temperatures, using an electrochemical interface potentiostat/galvanostat and a frequency response analyzer.

Phase shifts of the first sinusoidal current were correlated with corresponding environmental temperatures as $T_{anode}$.

Phase shifts of the second sinusoidal current were correlated with corresponding environmental temperatures as $T_{cathode}$.

Phase shifts were collected at various states-of-charge (SoC), and various environmental/internal cell temperatures over the –20° C. to 66° C. range.

FIG. 8 is graph 800 of phase shift versus temperature for $T_{anode}$ measured in the absence of charge or discharge at 20%, 50% and 80% state-of-charge (SoC) and averaged; each data point represent the mean (shown as a dot) and standard deviation (shown as a vertical line with bars).

FIG. 9 is graph 900 of phase shift versus temperature for $T_{cathode}$ measured in the absence of charge or discharge at 20%, 50% and 80% state-of-charge (SoC) and averaged; each data point represent the mean (shown as a dot) and standard deviation (shown as a vertical line with bars).

$T_{anode}$ and $T_{cathode}$ calibration data was then validated at various temperatures. Prior to each validation procedure, the cell was placed in the environmental chamber to equalize the internal temperature of the cell with the environmental temperature.

The battery testing system was used for charging and discharging the cell, and a K-type thermocouple was mounted to an outer surface of the cell to monitor surface temperature, $T_{surf}$, of the cell.

At each environmental temperature, first and second sinusoidal currents were applied to the cell, each current having a frequency within a corresponding one of ranges 40 Hz to 100 Hz and 10 Hz to 20 Hz. Phase shift data was collected, and surface temperatures were recorded as the discharge rate was varied in steps to alter the internal temperature of the cell.

The phase shift data was then converted to temperatures $T_{anode}$ and $T_{cathode}$ based on the correlations, such as illustrated in FIGS. 8 and 9.

FIGS. 10 through 13 are graphs of validation data associated with respective environmental chamber temperatures of 0° C., 10° C., 20° C., and 30° C.

FIGS. 10 through 13 each include environmental chamber temperature, $T_{env}$, anode temperature $T_{anode}$, cathode temperature $T_{cathode}$, cell surface temperature $T_{surf}$ and discharge current. The horizontal axes represent time in hours, the vertical axes on the right correspond to the discharge current, and the vertical axes on the left correspond to temperatures $T_{env}$, $T_{anode}$, $T_{cathode}$, and $T_{surf}$.

FIGS. 10 through 13 illustrate that $T_{surf}$, $T_{anode}$, and $T_{cathode}$ vary with the discharge current, and thus correspond to internal cell temperatures.

FIGS. 10 through 13 illustrate that magnitudes of the changes in $T_{surf}$, $T_{anode}$, and $T_{cathode}$ depends to some extent on $T_{env}$.

FIGS. 10 through 13 further illustrate that $T_{anode}$ and $T_{cathode}$ respond more quickly to changes in the discharge current than $T_{surf}$ which confirms that $T_{anode}$ and $T_{cathode}$ respond more quickly to internal cell temperature.

FIGS. 10 through 13 further illustrate that $T_{anode}$ and $T_{cathode}$ tend to be higher than the surface temperature $T_{surf}$ which is likely due to insulation provided by the cell housing and/or other factors.

FIGS. 11 through 14 further illustrate that $T_{anode}$ tends to be higher than $T_{cathode}$.

The evaluation data thus demonstrates that phase-shift based temperature determinations reliably and rapidly track dynamic changes in $T_{anode}$ and $T_{cathode}$ temperatures of a 4.4-Ah cell under charge and discharge across various environment temperatures.

Related evaluations have been performed with respect to other lithium-ion cells, including a 51 Ah cell.

Evaluations of various lithium-ion cells and sensors indicate that phase-to-temperature correlations obtained from a lithium-ion cell may be reliably used to determine internal temperatures of other lithium-ion cells from phase shifts detected in the corresponding other cells, including cells within a range of 4.3 Ah and 51 Ah, and cells of different manufacturers and/or models.

FIG. 14 is an image of a temperature sensor circuit 1400 to detect phase shifts in a lithium-ion cell and determine an internal temperature of the cell based on the phase shift.

Circuit 1400 is designed for cells having a capacity within a range of at least 2 Ah to 51 Ah.

Circuit 1400 may perform a temperature measurement in approximately 200-millisecond, and may be implemented to monitor four cells in a battery pack through multiplexing in less than 1 second.

Circuit 140 may be powered by a monitored cell. Evaluations have shown that circuit 1400 drains 2.15 Ah a lithium-ion the cell at a rate of approximately 100-mA DC, for 200 milliseconds per measurement. This is equivalent to 5.5-μAh, which is a relatively miniscule amount of the cell's capacity. At this rate, internal temperature the cell may be determined more than 396,000 times. In other words, for a fully charged cell, $T_{anode}$ may be monitored continuously 550 hours.

As another metric, without circuit 1400, the 2.15 Ah cell may support a 3.6 Watt (W) load at the rate of constant C/2, or a 1.05 Amp current drain. Absent circuit 1400, the cell may support the 3.6 W load for approximately 120 minutes. Where circuit 1400 is powered by the cell and operates continuously, the cell may support the 3.6 W load and circuit 1400 for approximately 109 minutes.

The 11 minute difference may be a relatively small cost for continuous and accurate monitoring of the cell for sudden temperature changes.

Moreover, temperature may be determined or sampled periodically rather than continuously, which may reduce power consumption.

Circuit 1400 includes four-probes to connect to positive and negative terminals of a cell, such as described in examples above. Wire lengths between circuit 1400 and a cell do not affect the outcome of the measurement or operation of circuit 1400.

Being enabled to detect, and therefore also monitor, the internal temperature of a cell may further allow the use of internal temperature as a charge controlling parameter. In other words, some example embodiments may provide a device configured to monitor the internal temperature of one or more battery cells in order to control charging of the battery cell in a way that will avoid overcharge-induced damage to the battery cell. Lithium-ion cells that are used in laptops, uninterrupted power supplies (UPS), electric grids and electric vehicles (EV) can have varying shapes, sizes and energy capacities. For many of these battery cells, charging can be relatively slow. In this regard, in order to prevent overcharging, which can damage the cell, while charging the battery to full capacity (e.g., the point of full charge (PFC) where the battery is at 100% state of charge), the battery cells are typically charged relatively slowly. For example, many laptops are charged over a period of about four hours to achieve charging to PFC and many UPS and EVs are charged for at least about eight hours to achieve charging to PCF. While charging to PFC, the battery cell may heat up and, if overcharged, the battery cell may vent, which would render the equipment the battery cell powers unusable. Venting involves the spewing of high surface area carbonaceous materials and gases. Venting can occur when charging current is forced through a cell after it is charged to its designed capacity or if the cell is maintained in a relatively hot environment. During overcharging or heating, the organic solvents inside the battery cell may tend to decompose and generate gaseous products. The gas pressure may then increase the pressure inside the sealed environment of the battery cell until a venting episode is caused.

Overcharge-induced venting generally does not lead to fire, unless the environment surrounding the cell is capable of igniting the gas evolving from the cell. The escaping gas frequently ejects the low-density and high surface area carbonaceous material out of the cell in the form of a cloud, creating the appearance of fumes. Venting-related fume-like manifestations may look like a fire event is occurring. However, fire events are typically more commonly associated with thermal runaway, which is generally associated with chemical instability that can occur without the assistance of overcharging. Thus, at least with respect to venting, preventing overcharging can assist in venting prevention. Venting induced by overcharging generally does not occur immediately after gas formation is initiated. Thus, a period of latency exists between the time when gas evolution within the cell begins and the time at which the pressure reaches a point sufficient to induce venting.

The general problems associated with slow charging and the possibility of venting each occur with more frequency due to the lack of a sensor or technique for properly identifying the time when PFC is reached. In this regard, cell voltage monitoring is the most common technique for attempting to identify and prevent overcharging today. However, voltage monitoring is not entirely successful in eliminating venting and may actually result in undercharging of cells. Voltage monitors are designed to prevent overcharging by identifying a preset cutoff voltage and then removing charging current when the cell voltage reaches the cutoff voltage. Overcharging is generally defined as sending charging current through a cell after the cell reaches 100% state of charge. Cell voltage is generally appreciated as not being an indicator of the state of charge of a Lithium-ion battery cell, because the rate of change of cell voltage is generally flat during charging. Thus, selection of a voltage limit as the cutoff voltage for overcharging prevention generally involves the selection of an arbitrary value that is likely to be hit before 100% state of charge is reached. Given that the value is somewhat arbitrary, undercharging will tend to be the result for new cells, while overcharging could still result in aged cells. Cell monitoring to accurately determine PFC may therefore be more useful than measuring cell voltage.

An intrinsic property of a typical battery cell that is most affected by overcharging is the internal impedance of the cell. When a cell reaches its PFC, the cell will tend to experience a sharp increase in internal resistance and a sharp decrease in the entropy of the anode. Each cell normally exhibits a resistance to the flow of a charging current, which causes Joule heating in the cell. This Joule heating causes batteries to feel warm to the touch during charging. In addition, decreasing entropy of the anode during charging also generates thermal energy inside the cell. When a cell is fully charged, and therefore at the PFC, the cell's internal impedance will rise, and the entropy of the anode will decrease, relatively sharply in a short time. For example, in a fully charged cell, the carbon anode may be fully lithiated, with little room for additional lithium or lithium ions. In electrical parlance, the flow of the charged species, i.e., lithium ions, from the electrolyte into the carbon anode, always experiences impedance. The impedance sharply increases when the space for lithium in the carbon anode goes from having some capacity to receive, to having no capacity to receive. The sharp increase in internal impedance at the PFC will cause a concomitant sharp increase in the joule heating and the cells internal temperature. Similarly, the charging process brings the lithium ions in the electrolyte with a relatively high degree of freedom into the anode, decreasing their degree of freedom and decreasing their entropy; the rate of change of entropy is higher when the anode is fully packed, i.e., when the cell reaches PFC. The decreasing entropy releases heat energy. Accordingly, measuring the internal temperature of the cell to detect the sharp increase in temperature can be a very useful way to detect or identify when PFC is reached. In this regard, for example, if the rate of anode temperature rise increases by a factor of greater than about seven (and in some cases in a range between about 7 and about 10), then the PFC may be relatively accurately determined to be reached.

Of note, there is a latency period between the internal temperature rise of the cell and the time it takes for the temperature rise to propagate through the cell to be detectable at the surface of the cell. Thus, measuring cell surface temperature to detect a rapid increase may also indicate that the cell has reached PFC. However, detection of such an increase at the cell surface necessarily means that the PFC was passed some time ago. Moreover, in some cases, the latency period may be significant enough that even if cell charging is secured when the rapid rise of surface temperature is detected, cell damage and perhaps even venting may already occur or be unavoidable.

In some embodiments, at a normal charging rate of C/2, where C is the ampere-hour capacity of the cell (Ah-capacity), the difference in time between PFC and the point of venting could be as much as about 10 minutes. However, if faster charging is desired, the time difference may decrease. Thus, particularly in embodiments where rapid charging is desirable, identifying PFC based on detection of increased rate of internal temperature rise may be beneficial. Additionally, PFC can change over time and for different charge-discharge cycles so that detecting PFC on the basis of internal temperature, and independent of cell voltage and/or external or surface temperature of the cell will tend to be the most efficient and safe way to control battery charging for optimal results.

FIG. 15 illustrates a block diagram of a battery charging system that is configured to control charging on the basis of internal battery temperature monitoring according to an example embodiment. As shown in FIG. 15, the battery charging system 1500 may include a charging source 1510, at least one battery cell 1520, a battery internal temperature sensor (BITS) 1530 that is configured to measure an internal temperature of the at least one battery cell responsive to charging of the at least one battery cell by the charging source, and a charge controller 1540. The charge controller may be configured to receive indications of the internal temperature of the at least one battery cell over time, identify an indication that the at least one battery cell is at PFC based on changes in the internal temperature, and interrupt power delivery from the charging source to the at least one battery cell responsive to the indication that the at least one battery cell is at the PFC.

In an example embodiment, the charging source 1510 may be any suitable power source that is capable of providing at least a constant charging current. The at least one battery cell may include one or more battery cells of any suitable type, although Lithium-ion batteries may be provided in one embodiment. Meanwhile, the charge controller 1540 may employ processing circuitry in order to execute monitoring and control functions of an example embodiment.

In another example embodiment, the charging source 1510 may be any suitable power source that is capable of providing at least a constant charging voltage. The at least one battery cell may include one or more battery cells of any suitable type, although Lithium-ion batteries may be provided in one embodiment. Meanwhile, the charge controller 1540 may employ processing circuitry in order to execute monitoring and control functions of an example embodiment.

In yet another example embodiment, the charging source 1510 may be any suitable power source that is capable of providing a combination of at least a constant charging current and constant charging voltage. The at least one battery cell may include one or more battery cells of any suitable type, although Lithium-ion batteries may be provided in one embodiment. Meanwhile, the charge controller 1540 may employ processing circuitry in order to execute monitoring and control functions of an example embodiment.

In some embodiments, the charge controller 1540 may be configured to interrupt power delivery in less than one second from receipt of the indication. In an example embodiment, the charge controller 1540 may be configured to interrupt power delivery independent of a surface temperature and/or cell voltage of the at least one battery cell. In other words, for example, surface temperature and/or cell voltage may not be considered relative to determinations regarding securing charging power delivery to the cell, so that internal temperature is the only parameter considered. In some cases, the charge controller 1540 may be configured to identify the indication that the battery cell is at the PFC based on monitoring a rate of increase in the internal temperature measured by the BITS 1530. In this regard, for example, the charge controller 1540 may be configured to identify the indication that the cell is at the PFC based on a rate of increase in the internal temperature being greater than a factor of about seven (or in some cases between about seven and ten) within about one second. In other words, for example, if the rate of temperature increase is about 0.1° C./minute and an increase to greater than about 0.7° C./minute is detected, the increase in rate of temperature change may be determined to correspond to achievement of PFC.

In some embodiments, employment of the BITS 1530 may allow charging using only a constant current charging step so that no constant voltage step is needed. By eliminating the constant voltage step (e.g., maintaining a constant voltage while charging the battery cell for a period of time) charging time may be reduced by 30% or more. The rate of charging within the constant current step may also be increased from the conventional value of less than or equal to C/2 to greater than C so that achievement of full charging may be accomplished in less than sixty minutes.

The BITS 1530 may employ the internal temperature sensing techniques described above in connection with the examples of FIGS. 1 to 14. As such, for example, the BITS 1530 may be configured to sense temperature of the anode in near real time directly, and without the use of mathematical model or mathematical algorithm. In this regard, in some cases, the BITS 1530 may be configured to sense temperatures on the microsecond time scale. The BITS 1530 may therefore monitor internal battery cell temperature in order to detect instantaneous increases in the heat generated inside the cell to identify PFC responsive to the rate of internal temperature increase experiencing a relatively sharp increase in a relatively short time.

In an example embodiment, the system 1500 may further include an active cooling component 1550. The active cooling component 1550 may be configured to remove heat from the cell while the cell is being charged at a high charging rate. The active cooling component 1550 may remove heat from the cell to a sufficient degree to allow faster charging of the battery cell. Given that faster charging may typically also cause more heat generation, the heat removal may help to maintain lower internal temperatures to avoid venting. However, regardless of how effective the active cooling component 1550 is at keeping internal temperature low, when PFC is reached, the characteristic sharp increase in internal temperature may still be experienced. Thus, even in an active cooling scenario, PFC can be detected based on rate of internal temperature increase. This opens the possibility to be able to provide increasing amounts of active cooling for corresponding increases in rate of charge so that, by providing active cooling, the rate of charge can be controlled in a safe manner to permit consistently safe and efficient charging to the PFC without risking cell damage. In some embodiments, even for laptop, EV or UPS batteries, the PFC may be reached in less than thirty minutes by charging the cell at 2 C rate, where C is the battery cell's ampere-hour capacity. Similarly, the PFC may be reached in 10 minutes by charging the cell at 6 C rate, or in 6 minutes by charging the cell at a 10 C rate. In all of these examples, the BITS sensor may monitor the rate of change of the cell's internal temperature, e.g., more specifically, the cell's anode temperature, and the associated sharp change, as the charging current takes the cell's capacity to its PFC. Accordingly, relatively high rates of charge may be utilized to achieve fast charging and an inversely proportional relationship may be established between the rate of charge and the time of charge. Since conventional Li-ion cells are typically recommended to be charged at a C/2 rate or less to 85% PFC, followed by a prolonged constant voltage charging to allow the charging current to drop far below C/2, example embodiments may provide a significant reduction in charge times, while still avoiding damage to the cell.

FIG. 16 illustrates a block diagram showing one example of a charge controller 1540 of one example embodiment. In this example, the charge controller 1540 is embodied as a computer or processing circuitry controlled device. Thus, for example, the charge controller 1540 may include processing circuitry 1600 that may be configured to perform data processing, control function execution and/or other processing and management services according to an example embodiment of the present invention. In some embodiments, the processing circuitry 1600 may be embodied as a chip or chip set. In other words, the processing circuitry 1600 may comprise one or more physical packages (e.g., chips) including materials, components and/or wires on a structural assembly (e.g., a baseboard).

In an example embodiment, the processing circuitry 1600 may include one or more instances of a processor 1610 and memory 1620 that may be in communication with or otherwise control a device interface 1630 and, in some cases, a user interface 1640. As such, the processing circuitry 1600 may be embodied as a circuit chip (e.g., an integrated circuit chip) configured (e.g., with hardware, software or a combination of hardware and software) to perform operations described herein.

The user interface 1640 (if implemented) may be in communication with the processing circuitry 1600 to receive an indication of a user input at the user interface 1640 and/or to provide an audible, visual, mechanical or other output to the user. As such, the user interface 1640 may include, for example, a display, one or more buttons or keys (e.g., function buttons), and/or other input/output mechanisms (e.g., keyboard, microphone, speakers, cursor, joystick, lights and/or the like). The user interface 1640 may display information relating to battery charging parameters. Moreover, in some cases, the user interface 1640 may include options for selection of one or more reports to be generated based on a particular charging evolution.

The device interface 1630 may include one or more interface mechanisms for enabling communication with other external devices (e.g., the charging source 1510) or internal functional components of the charge controller 1540. In some cases, the device interface 1630 may be any means such as a device or circuitry embodied in either hardware, or a combination of hardware and software that is configured to receive and/or transmit data from/to devices in communication with the processing circuitry 1600.

In an exemplary embodiment, the memory 1620 may include one or more non-transitory memory devices such as, for example, volatile and/or non-volatile memory that may be either fixed or removable. The memory 1620 may be configured to store information, data, applications, instructions or the like for enabling the charge controller 1540 to carry out various functions in accordance with example embodiments of the present invention. For example, the memory 1620 could be configured to buffer input data for processing by the processor 1610. Additionally or alternatively, the memory 1620 could be configured to store instructions for execution by the processor 1610. As yet another alternative, the memory 1620 may include one or more databases that may store a variety of data sets indicative of charging patterns, charging parameters, processing algorithms and/or the like to be employed for the execution of example embodiments. Among the contents of the memory 1620, applications may be stored for execution by the processor 1610 in order to carry out the functionality associated with each respective application. In some cases, the applications may include directions for control of the charge controller 1540 to set criteria for identification of PFC or to report parameters relating to achievement of PFC. In some cases, the applications may further include directions for generating outputs and/or reports associated with analysis of patient data as described herein.

The processor 1610 may be embodied in a number of different ways. For example, the processor 1610 may be embodied as various processing means such as one or more of a microprocessor or other processing element, a coprocessor, a controller or various other computing or processing devices including integrated circuits such as, for example, an ASIC (application specific integrated circuit), an FPGA (field programmable gate array), or the like. In an example embodiment, the processor 1610 may be configured to execute instructions stored in the memory 1620 or otherwise accessible to the processor 1610. As such, whether configured by hardware or by a combination of hardware and software, the processor 1610 may represent an entity (e.g., physically embodied in circuitry—in the form of processing circuitry 1600) capable of performing operations according to example embodiments of the present invention while configured accordingly. Thus, for example, when the processor 1610 is embodied as an ASIC, FPGA or the like, the processor 1610 may be specifically configured hardware for conducting the operations described herein. Alternatively, as another example, when the processor 1610 is embodied as an executor of software instructions, the instructions may specifically configure the processor 1610 to perform the operations described herein.

In an example embodiment, the processor 1610 (or the processing circuitry 1600) may be embodied as, include or otherwise control the charge controller 1540. As such, in some embodiments, the processor 1610 (or the processing circuitry 1600) may be said to cause each of the operations described in connection with the charge controller 1540 by directing the charge controller 1540 to undertake the corresponding functionalities responsive to execution of instructions or algorithms configuring the processor 1610 (or processing circuitry 1600) accordingly.

FIG. 17 is a flowchart of a method and program product according to an example embodiment of the invention. It will be understood that each block of the flowchart, and combinations of blocks in the flowchart, may be implemented by various means, such as hardware, firmware, processor, circuitry and/or other device associated with execution of software including one or more computer program instructions. For example, one or more of the procedures described above may be embodied by computer program instructions. In this regard, the computer program instructions which embody the procedures described above may be stored by a memory device of a user terminal (e.g., the charge controller 1540) and executed by a processor in the user terminal. As will be appreciated, any such computer program instructions may be loaded onto a computer or other programmable apparatus (e.g., hardware) to produce a machine, such that the instructions which execute on the computer or other programmable apparatus create means for implementing the functions specified in the flowchart block(s). These computer program instructions may also be stored in a computer-readable memory, which in one or more example embodiments is non-transitory, that may direct a computer or other programmable apparatus to function in a particular manner, such that the instructions stored in the computer-readable memory produce an article of manufacture which implements the functions specified in the flowchart block(s). The computer program instructions may also be loaded onto a computer or other programmable apparatus to cause a series of operations to be performed on the computer or other programmable apparatus to produce a computer-implemented process such that the instructions which execute on the computer or other programmable apparatus implement the functions specified in the flowchart block(s).

Accordingly, blocks of the flowchart support combinations of means for performing the specified functions and combinations of operations for performing the specified functions. It will also be understood that one or more blocks of the flowchart, and combinations of blocks in the flowchart, can be implemented by special purpose hardware-based computer systems which perform the specified functions, or combinations of special purpose hardware and computer instructions.

In this regard, a method of enabling fast charging of a battery cell according to one example embodiment of the invention is shown in FIG. 17. The method of FIG. 17 may entirely, or at least in part, be executed automatically (e.g., without operator interaction to initiate each step or the series of steps) by processing circuitry. The method may include receiving indications of an internal temperature of at least one battery cell from a battery internal temperature sensor at operation 1710, identifying an indication that the at least one battery cell is at a point of full charge based on changes in the internal temperature at operation 1720, and interrupting power delivery from a charging source to the at least one battery cell responsive to the indication that the at least one battery cell is at the point of full charge at operation at operation 1730.

Test data gathered in connection with an example embodiment may illustrate some of the concepts described above. In this regard, according to one example test, 18650 Li-ion cells were tested to demonstrate an absence of sensitivity to cell voltage for overcharging, while also showing that internal temperature is a key process in relation to over charging. Example embodiments employ a BITS to monitor internal temperature and show that there is a correlation to achievement of PFC and, very soon thereafter, a sudden increase in internal temperature. Thus, the test data further demonstrates that using BITS with forced cooling has little effect on either preventing or slowing the increase in internal temperature when PFC is reached. Thus, the magnitude of the rate of increase in the internal temperature is relatively identical whether or not forced cooling is employed. This means that PFC can be identified by monitoring internal temperature even when forced cooling is employed.

In an example embodiment, eight unused 18650 Li-ion cells were subjected to two or more charge-discharge cycles at room temperature before they were charged to 100% state of charge (SoC), which represents full charge. A commercial battery charge-discharge unit that employs a so-called Constant Current-Constant Voltage (CCCV) procedure with appropriate voltage limits to prevent overcharge or overdischarge was used. The cells were also independently tested for their internal impedance. Cells that had quite similar internal impedance were used in the overcharge versus internal temperature tests. A calibrated BITS was also used. The BITS made measurements "online" while cells were being discharged and charged. During testing, the cells were held in 18650 cell holders, the body of which is plastic. When fully inserted into the holder, one half of the cylindrical body of the cells was covered by plastic, while the other half was exposed to the environment. A thermocouple was also placed on the exposed part of the cell body to measure surface temperature of the cell.

Cells were tested in two types of thermal environments. In the first type of environment, the cells were placed in a normal ambient environment with no active cooling. The ambient temperature was 23.5° C. In the second environment, cells were placed inside a closed thermal chamber having a temperature maintained at 23.5° C. The air inside the chamber was under constant circulation causing accelerated heat transfer between the surface of the cells and their surroundings.

FIG. 18 illustrates a charge-discharge current profile with the corresponding cell voltage and ambient temperature (no forced cooling) according to an example embodiment. In this regard, the chart 1800 of FIG. 18 shows cell current, cell voltage and ambient temperature. Negative current represents discharging and positive current represents charging. FIG. 19 illustrates a chart 1900 showing the same set of cell operating conditions as FIG. 18, with the cell's discharge-capacity and charge-capacity (in units of Ah) superimposed. Note that the cell reached full capacity at 2.5-Ah. Thus, additional charging above 2.5-Ah represents overcharging.

FIG. 20 shows the internal temperature 2010 profile during the charge process demonstrated in FIG. 19 according to an example embodiment. Thus, FIG. 20 illustrates 7200 seconds of discharging followed by about 7200 seconds of charging. The BITS captured data at a rate of about 0.6 seconds per data point. During C/2 rate charging, the cell reached full capacity at 2.5-Ah. A rapid increase in internal temperature is demonstrated immediately after the PFC is reached at point 2020. In this regard, while a rate of temperature increase was about 0.07° C./minute before PFC, after crossing PFC, the rate of temperature increase rapidly reached 0.3° C./minute and 0.7° C./minute. About 10 minutes after PFC is reached, the internal temperature reached a maximum of 42° C., where venting occurred (about 10 minutes after crossing PFC), and the internal temperature began to fall. Cell voltage is insensitive to PFC and the point of venting.

FIG. 21 shows the cell surface temperature measured during the same charging process shown in FIG. 19. As can be appreciated from FIG. 21, the cell surface temperature 2110 generally increases during discharge, but decreases at a few normal milestone locations during the discharge process. The cell surface temperature also decreases initially during the charging process, but then begins to increase until venting occurs. The curves 2100 shown in FIG. 21 clearly show that the surface temperature is insensitive to overcharging.

FIGS. 22 and 23 correspond to the same situations that were presented in FIGS. 20 and 21, respectively, except that the data of FIGS. 22 and 23 were gathered in the presence of active cooling while the cell was under discharge and charge. As can be appreciated from FIGS. 22 and 23, even in the presence of active cooling, surface temperature is insensitive to overcharging, but internal temperature remains equally capable of indicating when PFC is reached based on the change in the rate of temperature increase.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

What is claimed is:

1. A battery charging system comprising:
    a charging source; and
    at least one battery cell;
    a battery internal temperature sensor configured to measure an internal temperature directly, and without the use of mathematical model or mathematical algorithm, of the at least one battery cell responsive to charging of the at least one battery cell by the charging source, the battery internal temperature sensor comprising:
        an alternating signal source to apply an alternating signal to the cell to generate a phase-shifted alternating signal at the cell;
        a phase meter to detect the phase-shift as a phase difference between a frequency of the applied alternating signal and a frequency of the phase-shifted alternating signal; and
        a phase-to-temperature converter to determine the internal temperature of the cell based on the phase difference;
        wherein the alternating signal source includes one or more of an alternating current source to generate a phase-shifted alternating voltage, and an alternating voltage source to generate a phase-shifted alternating current; and
    a charge controller configured to:
        receive indications of the internal temperature of the at least one battery cell over time,
        identify an indication that the at least one battery cell is at a point of full charge based on changes in the internal temperature, and
        interrupt power delivery from the charging source to the at least one battery cell responsive to the indication that the at least one battery cell is at the point of full charge.

2. The battery charging system of claim 1, wherein the charge controller is configured to interrupt power delivery in less than one second from receipt of the indication.

3. The battery charging system of claim 1, wherein the charge controller is configured to interrupt power delivery independent of a surface temperature of the at least one battery cell.

4. The battery charging system of claim 1, wherein the charge controller is configured to interrupt power delivery independent of a cell voltage of the at least one battery cell.

5. The battery charging system of claim 1, wherein the charge controller is configured to interrupt power delivery independent of a surface temperature and a cell voltage of the at least one battery cell.

6. The battery charging system of claim 1, wherein the charge controller is configured to identify the indication that the at least one battery cell is at the point of full charge based on monitoring a rate of increase in the internal temperature.

7. The battery charging system of claim 6, wherein the charge controller is configured to identify the indication that the at least one battery cell is at the point of full charge based on a rate of increase in the internal temperature being greater than a factor of about seven within about one second.

8. The battery charging system of claim 6, wherein the charge controller is configured to identify the indication that the at least one battery cell is at the point of full charge based on the internal temperature increasing by a factor of about seven to about ten within about one second.

9. The battery charging system of claim 1, further comprising an active cooling component configured to remove heat from the at least one battery cell responsive to charging from the charging source, the active cooling component enabling the point of full charge to be reached in a time that is inversely proportional to a rate of charging the at least one battery cell.

10. A battery charging controller being in communication with a battery internal temperature sensor configured to measure an internal temperature of at least one battery cell responsive to charging of the at least one battery cell by a charging source, the battery internal temperature sensor comprising:
    an alternating signal source to apply an alternating signal to the cell to generate a phase-shifted alternating signal at the cell;
    a phase meter to detect the phase-shift as a phase difference between a frequency of the applied alternating signal and a frequency of the phase-shifted alternating signal; and
    a phase-to-temperature converter to determine the internal temperature of the cell based on the phase difference;
    wherein the alternating signal source includes one or more of an alternating current source to generate a phase-shifted alternating voltage, and an alternating voltage source to generate a phase-shifted alternating current;
    and wherein the battery charging controller comprises processing circuitry, the processing circuitry being configured to:
    receive indications of the internal temperature of the at least one battery cell over time;
    identify an indication that the at least one battery cell is at a point of full charge based on changes in the internal temperature; and
    interrupt power delivery from the charging source to the at least one battery cell responsive to the indication that the at least one battery cell is at the point of full charge.

11. The battery charging controller of claim 10, wherein the processing circuitry is configured to interrupt power delivery in less than one second from receipt of the indication.

12. The battery charging controller of claim 10, wherein the processing circuitry is configured to interrupt power delivery independent of a surface temperature of the at least one battery cell.

13. The battery charging controller of claim 10, wherein the processing circuitry is configured to interrupt power delivery independent of a cell voltage of the at least one battery cell.

14. The battery charging controller of claim 10, wherein the processing circuitry is configured to interrupt power delivery independent of a surface temperature and a cell voltage of the at least one battery cell.

15. The battery charging controller of claim 1, wherein the processing circuitry is configured to identify the indication that the at least one battery cell is at the point of full charge based on monitoring a rate of increase in the internal temperature.

16. The battery charging controller of claim 6, wherein the processing circuitry is configured to identify the indication that the at least one battery cell is at the point of full charge based on a rate of increase in the internal temperature being greater than a factor of about seven within about one second.

17. The battery charging controller of claim 6, wherein the processing circuitry is configured to identify the indication that the at least one battery cell is at the point of full charge based on the internal temperature increasing by a factor of about seven to about ten within about one second.

18. The battery charging controller of claim 10, wherein the battery charging controller is configured to monitor charging of the at least one battery cell while the at least one battery cell is in communication with an active cooling component configured to remove heat from the at least one battery cell responsive to charging from the charging source, the active cooling component enabling the point of full charge to be reached in a time that is inversely proportional to a rate of charging the at least one battery cell.

19. A method comprising:
    receiving indications of an internal temperature of at least one battery cell from a battery internal temperature sensor;
    identifying an indication that the at least one battery cell is at a point of full charge based on changes in the internal temperature; and
    interrupting power delivery from a charging source to the at least one battery cell responsive to the indication that the at least one battery cell is at the point of full charge;
    wherein the battery internal temperature sensor comprises:
        an alternating signal source to apply an alternating signal to the cell to generate a phase-shifted alternating signal at the cell;
        a phase meter to detect the phase-shift as a phase difference between a frequency of the applied alternating signal and a frequency of the phase-shifted alternating signal; and
        a phase-to-temperature converter to determine the internal temperature of the cell based on the phase difference;
        wherein the alternating signal source includes one or more of an alternating current source to generate a phase-shifted alternating voltage, and an alternating voltage source to generate a phase-shifted alternating current.

20. The method of claim 19, wherein identifying the indication comprises identifying that the at least one battery cell is at the point of full charge based on monitoring a rate of increase in the internal temperature to detect an increase in the rate of internal temperature rise of greater than a factor of about seven within about one second.

* * * * *